(12) United States Patent
Sasaki et al.

(10) Patent No.: US 10,313,621 B2
(45) Date of Patent: Jun. 4, 2019

(54) IMAGE PICKUP DEVICE, CONTROL METHOD, AND IMAGE PICKUP APPARATUS

(71) Applicant: SONY CORPORATION, Tokyo (JP)

(72) Inventors: Keita Sasaki, Kanagawa (JP); Tsutomu Nakajima, Tokyo (JP); Jun Hashizume, Tokyo (JP)

(73) Assignee: SONY CORPORATION, Tokyo (JP)

( * ) Notice: Subject to any disclaimer, the term of this patent is extended or adjusted under 35 U.S.C. 154(b) by 15 days.

(21) Appl. No.: 15/125,292

(22) PCT Filed: Mar. 6, 2015

(86) PCT No.: PCT/JP2015/056598
§ 371 (c)(1),
(2) Date: Sep. 12, 2016

(87) PCT Pub. No.: WO2015/141490
PCT Pub. Date: Sep. 24, 2015

(65) Prior Publication Data
US 2017/0078602 A1    Mar. 16, 2017

(30) Foreign Application Priority Data

Mar. 20, 2014   (JP) ................................. 2014-058760

(51) Int. Cl.
*H04N 5/378*    (2011.01)
*H04N 5/374*    (2011.01)
(Continued)

(52) U.S. Cl.
CPC ....... *H04N 5/378* (2013.01); *H01L 27/14609* (2013.01); *H01L 27/14632* (2013.01);
(Continued)

(58) Field of Classification Search
CPC ........ H04N 5/378; H04N 5/374; H04N 5/335; H01L 27/14632; H01L 27/14634; H01L 27/14643
See application file for complete search history.

(56) References Cited

U.S. PATENT DOCUMENTS

2004/0032627 A1\* 2/2004 Tsai .................. H01L 27/14643
358/514
2008/0100698 A1\* 5/2008 Mori .................. A61B 1/00036
348/65

(Continued)

FOREIGN PATENT DOCUMENTS

CN    101057490 A    10/2007
JP    2000-165820 A    6/2000
(Continued)

OTHER PUBLICATIONS

International Search Report and Written Opinion of PCT Application No. PCT/JP2015/056598, dated Apr. 14, 2015, 7 pages of English Translation and 7 pages of ISRWO.

(Continued)

*Primary Examiner* — Christopher K Peterson
(74) *Attorney, Agent, or Firm* — Chip Law Group

(57) ABSTRACT

[Object] The present technique relates to an image pickup device, a control method, and an image pickup apparatus with which more diverse pickup images can be obtained.
[Solving Means] An image pickup device according to the present technique includes: a pixel array that reads out pixel signals obtained by photoelectrically converting incident light, from each of a plurality of pixels in the pixel array; an analog processing unit that carries out signal processing on the analog pixel signals to obtain digital image data; a storage unit that stores the image data; a signal processing unit that carries out signal processing on the image data stored in the storage unit; an output unit that outputs the
(Continued)

image data stored in the storage unit; and a control unit that causes reading processing, analog processing, digital processing, and output processing to be executed at processing speeds independent from one another. The present technique is applicable to an image pickup device and an electronic apparatus, for example.

14 Claims, 19 Drawing Sheets

(51) Int. Cl.
    *H01L 27/146*     (2006.01)
    *H04N 5/335*     (2011.01)

(52) U.S. Cl.
    CPC .. *H01L 27/14634* (2013.01); *H01L 27/14643* (2013.01); *H04N 5/335* (2013.01); *H04N 5/374* (2013.01)

(56) References Cited

U.S. PATENT DOCUMENTS

| | | | |
|---|---|---|---|
| 2011/0261217 A1 | 10/2011 | Muukki et al. | |
| 2011/0279675 A1* | 11/2011 | Mano | G02B 13/001 348/148 |
| 2012/0005625 A1 | 1/2012 | Ro | |
| 2014/0071321 A1* | 3/2014 | Seyama | H04N 5/2353 348/308 |

FOREIGN PATENT DOCUMENTS

| | | |
|---|---|---|
| JP | 2005-341278 A | 12/2005 |
| JP | 2006-140642 A | 6/2006 |
| JP | 2009-105852 A | 5/2009 |
| JP | 2012-54495 A | 3/2012 |
| JP | 2012-054495 A | 3/2012 |

OTHER PUBLICATIONS

International Preliminary Report on Patentability of PCT Application No. PCT/JP2015/056598, dated Sep. 20, 2016, 5 pages.

Office Action for CN Patent Application No. 201580013063.3, dated Nov. 30, 2018, 8 pages of Office Action and 18 pages of English Translation.

Office Action for JP Patent Application No. 2016-508657, dated Apr. 18, 2019, 05 pages of Office Action and 03 pages of English Translation.

* cited by examiner

IMAGE PICKUP DEVICE, CONTROL METHOD, AND IMAGE PICKUP APPARATUS

CROSS REFERENCE TO RELATED APPLICATIONS

This application is a U.S. National Phase of International Patent Application No. PCT/JP2015/056598 filed on Mar. 6, 2015, which claims priority benefit of Japanese Patent Application No. 2014-058760 filed in the Japan Patent Office on Mar. 20, 2014. Each of the above-referenced applications is hereby incorporated herein by reference in its entirety.

TECHNICAL FIELD

The present invention relates to an image pickup device, a control method, and an image pickup apparatus, more particularly, to an image pickup device, a control method, and an image pickup apparatus with which more diverse pickup images can be obtained.

BACKGROUND ART

In image sensors of the related art, there has been no frame-storable memory (DRAM (Dynamic Random Access Memory) etc.) or a memory capable of storing a sufficient amount of lines (SRAM (Static Random Access Memory) etc.). Therefore, various processing such as reading of pixel signals, analog processing, digital processing, and output processing, that are carried out in the image sensors, have been executed at the same processing speed and processing rate (frame rate).

Incidentally, as a method of reading out signals from pixels in a pixel array unit in the image sensor, there has been a technique of providing a nonvolatile memory subsequent to a signal processing unit that digitizes analog pixel signals read out from pixels and reading out the digitized signals at high speed using the nonvolatile memory (see, for example, Patent Document 1).

Patent Document 1: Japanese Patent Application Laid-open No. 2004-64410

SUMMARY OF INVENTION

Problems to be Solved by the Invention

When executing the reading, the analog processing, the digital processing, the output processing, and the like at the same processing speed and processing rate (frame rate), the processing speed and processing rate (frame rate) are determined based on the slowest processing system. Since the output specification influences the latterly-connected apparatus in particular, it is difficult to freely set the processing speed and processing rate (frame rate). As a result, there has been a fear that other processing such as a shutter operation and signal processing will also be restricted by the processing speed and processing rate of the output processing, and it will become difficult to freely set the processing speed and processing rate for those processing. For example, it has been difficult to realize speed-up of the shutter operation and signal processing.

It should be noted that while high-speed reading can be realized by the method disclosed in Patent Document 1, it has been impossible to control the processing speeds of the digital processing and the output processing. It has also been difficult to control the processing rate. As described above, by the method disclosed in Patent Document 1, it has been difficult to obtain various pickup images by controlling the processing speed and processing rate of each processing.

The present technique has been made in view of the circumstances as described above and aims at enabling more diverse pickup images to be obtained.

Means for solving the Problems

According to an embodiment of the present technique, there is provided an image pickup device including: a pixel array that reads out pixel signals obtained by photoelectrically converting incident light, from each of a plurality of pixels in the pixel array; an analog processing unit that carries out signal processing on the analog pixel signals to obtain digital image data; a storage unit that stores the image data; a signal processing unit that carries out signal processing on the image data stored in the storage unit; an output unit that outputs the image data stored in the storage unit; and a control unit that causes the pixel array to execute reading processing of reading out the pixel signals, the analog processing unit to execute analog processing as signal processing on the analog pixel signals, the signal processing unit to execute digital processing as signal processing on the digital image data, and the output unit to execute output processing of outputting the image data, at processing speeds independent from one another.

The control unit may cause the reading processing and the analog processing to be executed at a higher speed than the digital processing and the output processing.

The control unit may further cause the digital processing to be executed at a lower speed than the output processing.

The control unit may cause the digital processing to be executed at a higher speed than the reading processing, the analog processing, and the output processing.

The control unit may cause the digital processing to be executed a plurality of times during a 1-frame processing period.

The control unit may cause the reading processing and the analog processing to be executed at a higher speed and higher rate than the digital processing and the output processing.

The storage unit may be a frame memory.

The frame memory may include a ring buffer that stores a predetermined number of latest frames.

The control unit may cause the digital processing to be executed on image data of a past frame stored in the ring buffer.

The frame memory may have a storage capacity capable of storing image data of a plurality of frames, and the control unit may cause the digital processing to be executed on image data of a past frame stored in the frame memory.

The image pickup device may further include a single semiconductor substrate, and the pixel array, the analog processing unit, the storage unit, the signal processing unit, the output unit, and the control unit may be formed on the semiconductor substrate.

The image pickup device may further include a plurality of semiconductor substrates superimposed on one another, and each of the pixel array, the analog processing unit, the storage unit, the signal processing unit, the output unit, and the control unit may be formed on the corresponding one of the plurality of semiconductor substrates.

According to an embodiment of the present technique, there is provided a control method including executing, at processing speeds independent from one another, reading processing of reading out pixel signals obtained by photoelectrically converting incident light, from each of a plurality of pixels in a pixel array, analog processing of carrying out signal processing on the analog pixel signals read out from the pixels of the pixel array to obtain digital image data, digital processing as signal processing on the digital image data stored in a storage unit, and output processing of outputting the digital image data stored in the storage unit.

According to another embodiment of the present technique, there is provided an image pickup apparatus including: an image pickup unit that photographs an object; and an image processing unit that carries out image processing on image data obtained by the image pickup unit, the image pickup unit including a pixel array that reads out pixel signals obtained by photoelectrically converting incident light, from each of a plurality of pixels in the pixel array, an analog processing unit that carries out signal processing on the analog pixel signals to obtain digital image data, a storage unit that stores the image data, a signal processing unit that carries out signal processing on the image data stored in the storage unit, an output unit that outputs the image data stored in the storage unit, and a control unit that causes the pixel array to execute reading processing of reading out the pixel signals, the analog processing unit to execute analog processing as signal processing on the analog pixel signals, the signal processing unit to execute digital processing as signal processing on the digital image data, and the output unit to execute output processing of outputting the image data, at processing speeds independent from one another.

In the embodiment of the present technique, the reading processing of reading out pixel signals obtained by photoelectrically converting incident light, from each of a plurality of pixels in a pixel array, the analog processing of carrying out signal processing on the analog pixel signals read out from the pixels of the pixel array to obtain digital image data, the digital processing as signal processing on the digital image data stored in the storage unit, and the output processing of outputting the digital image data stored in the storage unit are executed at processing speeds independent from one another.

In the image pickup apparatus according to the another embodiment of the present technique, the reading processing of reading out pixel signals obtained by photoelectrically converting incident light, from each of a plurality of pixels in a pixel array, the analog processing of carrying out signal processing on the analog pixel signals read out from the pixels of the pixel array to obtain digital image data, the digital processing as signal processing on the digital image data stored in the storage unit, and the output processing of outputting the digital image data stored in the storage unit are executed at processing speeds independent from one another, and the image data obtained by the image pickup as described above is subjected to image processing.

Effects of the Invention

According to the present technique, pickup images can be obtained. According to the present technique, it is also possible to obtain more diverse pickup images.

MODES FOR CARRYING OUT THE INVENTION

Hereinafter, configurations for embodying the present disclosure (hereinafter, referred to as embodiments) will be described. It should be noted that descriptions will be made in the following order.

1. First embodiment (image sensor)
2. Second embodiment (image sensor)
3. Third embodiment (image sensor)
4. Fourth embodiment (image pickup apparatus)

<1. First Embodiment>
<Processing Speed/Processing Rate>

In image sensors of the related art, there has been no frame-storable memory (DRAM (Dynamic Random Access Memory) etc.) or a memory capable of storing a sufficient amount of lines (SRAM (Static Random Access Memory) etc.). Therefore, various processing such as reading of pixel signals, analog processing, digital processing, and output processing, that are carried out in the image sensors, have been executed at the same processing speed and processing rate (frame rate).

Figure 1:
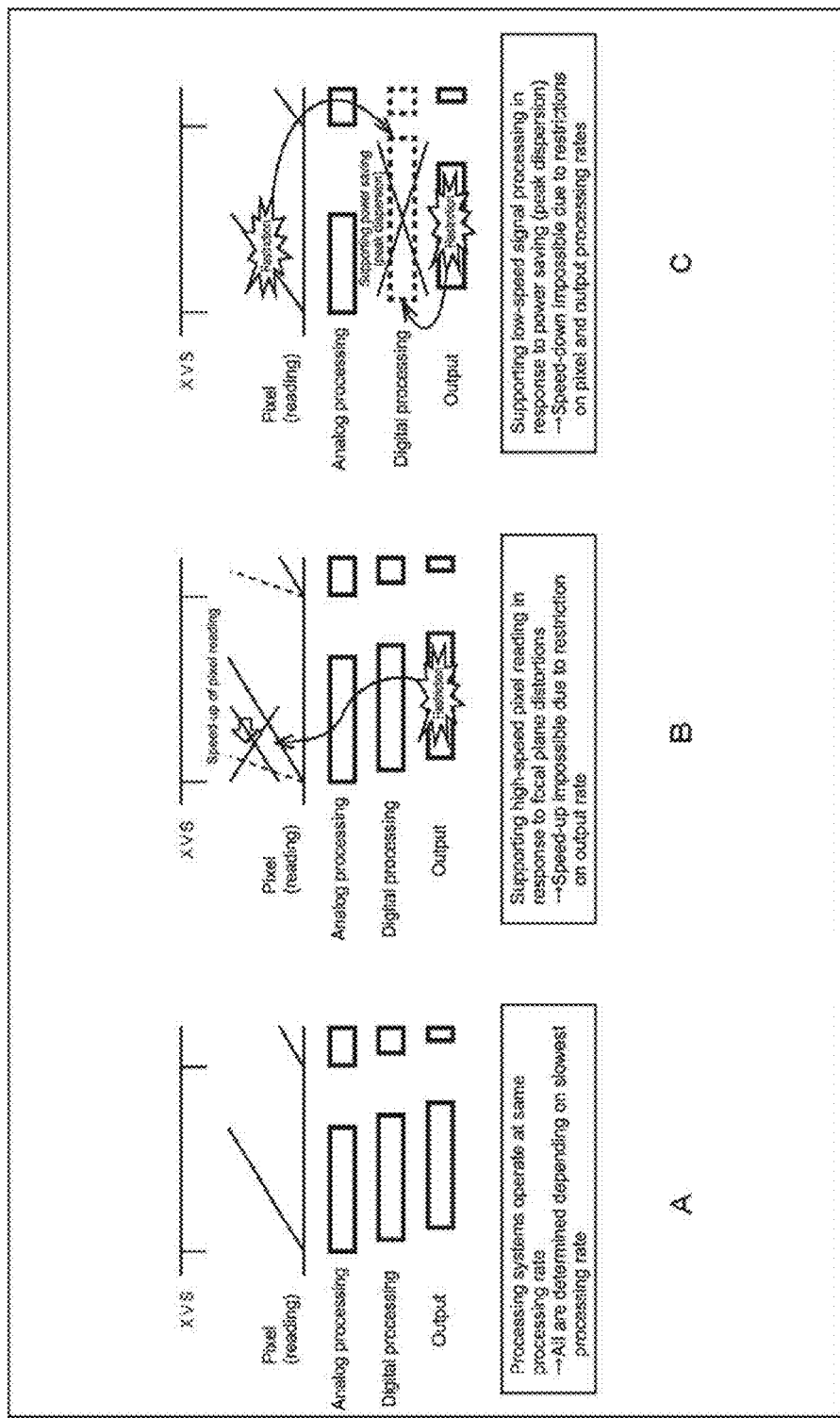
FIG. 1 Diagrams for explaining an operation example of each processing.

In this case, as in the example shown in FIG. 1A, the processing speed and processing rate (frame rate) of each processing are determined based on the slowest processing system. Since the output specification influences the latterly-connected apparatus in particular, it is difficult to freely set the processing speed and processing rate (frame rate). As a result, there has been a fear that other processing such as a shutter operation and signal processing will also be restricted by the processing speed and processing rate of the output processing, and it will become difficult to freely set the processing speed and processing rate for those processing. For example, it has been difficult to realize speed-up of the shutter operation and signal processing.

For example, as in the example shown in FIG. 1B, the processing speed of the output processing is determined by the output specification, and the processing speed of the reading processing of pixel signals is restricted by the processing speed of the output processing, that is, the output specification. Therefore, it has been difficult to realize speed-up of the reading processing.

Further, as in the example shown in FIG. 1C, for example, the processing speed of the digital processing is also restricted by the processing speeds of the reading processing and the output processing. Therefore, it has been difficult to realize speed-down of the digital processing.

It should be noted that although high-speed reading can be realized by the method disclosed in Patent Document 1, it has been impossible to control the processing speeds of the digital processing and the output processing. It has also been difficult to control the processing rates. As described above, it has been difficult to obtain various pickup images by controlling the processing speeds and processing rates of the processing by the method disclosed in Patent Document 1.

<Flow Control>

In this regard, a large-capacity storage unit capable of storing frames and a sufficient amount of lines is provided in the image sensor, and the storage unit is used to control the digital processing (flow control) independent from the reading processing, the analog processing, and the output processing. Then, operations of the processing are controlled so as to execute the reading processing, the analog processing, the digital processing, and the output processing at processing speeds independent from one another.

Here, the reading processing is, for example, processing of reading out pixel signals from pixels in a pixel array, the analog processing is, for example, signal processing that is carried out on the analog pixel signals read out from the pixels, the digital processing is, for example, signal processing that is carried out on digital image data obtained by A/D-converting the analog pixel signals, and the output processing is, for example, processing of outputting the digital image data.

Further, the storage unit is constituted of an arbitrary storage medium such as a DRAM (Dynamic Random Access Memory) and an SRAM (Static Random Access Memory).

With such a structure, the image pickup device can eliminate restrictions on the processing speeds among the processing, and the processing speed of each processing can be set freely. As a result, more diverse pickup images can be generated depending on a combination of the processing speeds of the processing.

It should be noted that not only the processing speed but also the processing rate (frame rate) of each processing may be set to be independent from one another. With such a structure, the image pickup device can generate more diverse pickup images.

<Image Sensor>

Figure 2:
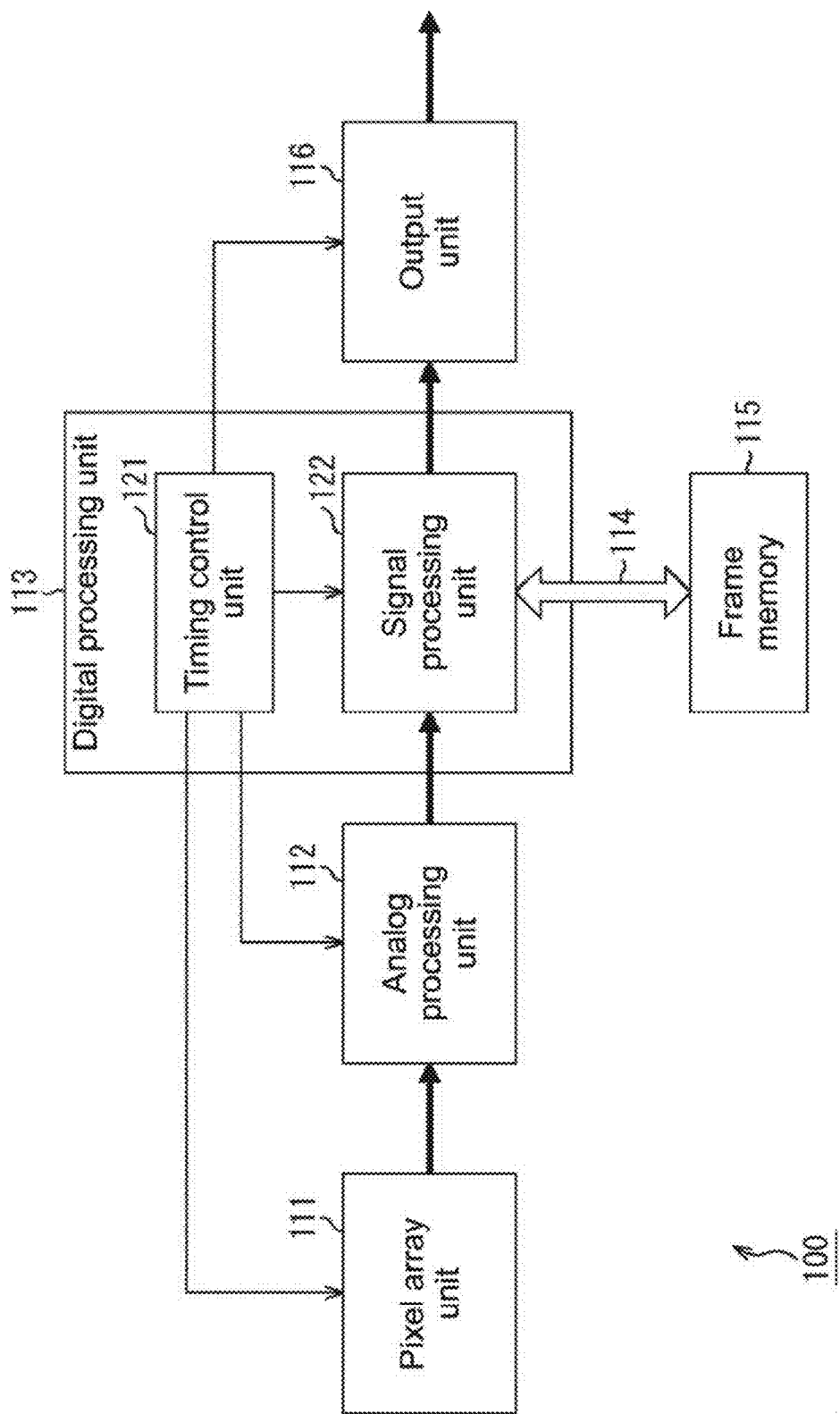
FIG. 2 A block diagram showing a main structural example of an image sensor.

The structural example of the image sensor as an embodiment of the image pickup device to which the present technique as described above is applied is shown in FIG. 2. The image sensor 100 shown in FIG. 2 is a device that photoelectrically converts light from an object and outputs it as image data. For example, the image sensor 100 is structured as a CMOS image sensor that uses CMOS (Complementary Metal Oxide Semiconductor), a CCD image sensor that uses CCD (Charge Coupled Device), or the like.

As shown in FIG. 2, the image sensor 100 includes a pixel array unit 111, an analog processing unit 112, a digital processing unit 113, a memory bus 114, a frame memory 115, and an output unit 116.

The pixel array unit 111 is a pixel area in which pixel structures (unit pixels) each including a photoelectric conversion device such as a photodiode are arranged on a plane or in a curve. Each unit pixel of the pixel array unit 111 receives light from an object, photoelectrically converts the incident light to accumulate charges, and outputs the charges as pixel signals at predetermined timings. The reading processing is processing of reading out pixel signals from the unit pixels as described above.

The analog processing unit 112 carries out analog processing on the analog pixel signals read out from the unit pixels of the pixel array unit 111. The analog processing includes, for example, A/D conversion processing of converting pixel signals into digital image data.

The digital processing unit 113 carries out signal processing or logic processing such as timing control on the digital image data A/D-converted by the analog processing unit 112. As shown in FIG. 2, the digital processing unit 113 includes a timing control unit 121 and a signal processing unit 122.

The timing control unit 121 controls operations of the pixel array unit 111, the analog processing unit 112, the signal processing unit 122, and the output unit 116 (e.g., processing speeds and processing rates (frame rates)). The signal processing unit 122 carries out signal processing on the digital image data A/D-converted by the analog processing unit 112. The digital processing includes, for example, primary processing of a sensor function such as pixel rearrangement processing and black level processing, secondary processing of image processing such as HDR (High Dynamic Range) processing and scaling processing of converting a resolution or aspect ratio, tertiary processing such as output control, and the like.

The signal processing unit 122 also writes and reads image data to/from the frame memory 115. For example, when writing image data, the signal processing unit 122 supplies the image data to the frame memory 115 via the memory bus 114. When reading out image data, the signal processing unit 122 requests the frame memory 115 of desired image data and acquires the image data via the memory bus 114. The signal processing unit 122 also carries out output control processing of outputting image data. For example, when outputting image data to an apparatus outside the image sensor 100, the signal processing unit 122 acquires the image data from the frame memory 115 via the memory bus 114 and supplies the image data to the output unit 116.

The memory bus 114 is a data transmission channel provided between the digital processing unit 113 (signal processing unit 122) and the frame memory 115. Data (image data etc.) stored in the frame memory 115 is transmitted via the memory bus 114.

The frame memory 115 is one embodiment of the storage unit described above and is a storage medium having enough capacity to store image data of one or more frames. The frame memory 115 is formed using a DRAM, for example. Of course, other semiconductor memories such as an SRAM and a flash memory may be used instead. The frame memory 115 stores image data supplied from the signal processing unit 122 via the memory bus 114. The frame memory 115 also supplies the stored image data to the signal processing unit 122 via the memory bus 114 according to a request from the signal processing unit 122. In other words, the frame memory 115 stores image data generated from pixel signals read out from the pixel array unit 111.

It should be noted that a line memory capable of storing image data of a sufficiently-large number of lines (line memory having sufficiently-large capacity) may be used in place of the frame memory 115.

The output unit 116 is constituted of, for example, a high-speed I/F (MIPI (Mobile Industry Processor Interface)) or an I/O cell and outputs image data acquired from the frame memory 115 via the signal processing unit 122 to an apparatus outside the image sensor 100.

<Unit Pixel Structure>

Figure 3:
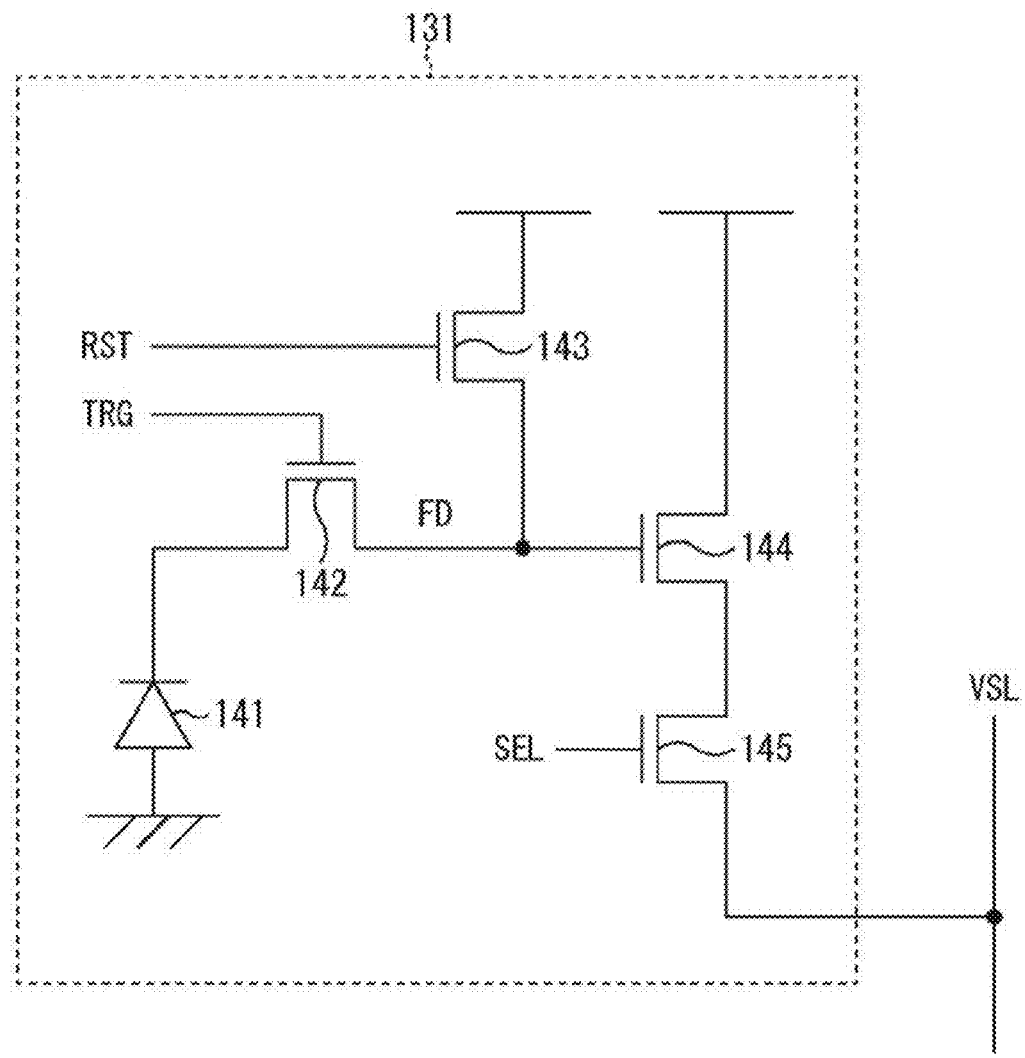
FIG. 3 A diagram showing a main structural example of a unit pixel.

Here, FIG. 3 shows a main structural example of each unit pixel formed in the pixel array unit 111. The unit pixels formed in the pixel array unit 111 basically have the same structure as that shown in the example of FIG. 3. In the case of the example shown in FIG. 3, a unit pixel 131 includes a photodiode 141, a read-out transistor 142, a reset transistor 143, an amplification transistor 144, and a select transistor 145.

The photodiode (PD) 141 photoelectrically converts received light into optical charges (photoelectrons herein) in a charge amount corresponding to a light amount of the received light and accumulates the optical charges. An anode electrode of the photodiode 141 is connected to a ground of a pixel area (pixel ground), and a cathode electrode thereof is connected to a floating diffusion (FD) via the read-out transistor 142.

The read-out transistor 142 controls reading of optical charges from the photodiode 141. A drain electrode of the read-out transistor 142 is connected to the floating diffusion, and a source electrode thereof is connected to the cathode electrode of the photodiode 141. Moreover, a control signal TRG is supplied to the gate electrode of the read-out transistor 142 from a pixel drive unit (not shown). When the control signal TRG (i.e., gate potential of read-out transistor 142) is off, optical charges are not read out from the photodiode 141 (optical charges are accumulated in photodiode 141). When the control signal TRG (i.e., gate potential of read-out transistor 142) is on, the optical charges accumulated in the photodiode 141 are read out and supplied to the floating diffusion (FD).

The reset transistor 143 resets the potential of the floating diffusion (FD). A drain electrode of the reset transistor 143 is connected to a power supply potential, and a source electrode thereof is connected to the floating diffusion (FD). Further, a control signal RST is supplied to the gate electrode of the reset transistor 143 from the pixel drive unit (not shown). When the control signal RST (i.e., gate potential of reset transistor 143) is off, the floating diffusion (FD) is separated from the power supply potential. When the control signal RST (i.e., gate potential of reset transistor 143) is on, charges of the floating diffusion (FD) are discarded to the power supply potential, and the floating diffusion (FD) is reset.

The amplification transistor 144 amplifies a potential change of the floating diffusion (FD) and outputs it as an electric signal (analog signal). A gate electrode of the amplification transistor 144 is connected to the floating diffusion (FD), a drain electrode thereof is connected to the power supply potential, and a source electrode thereof is connected to the drain electrode of the select transistor 145. For example, the amplification transistor 144 outputs the potential of the floating diffusion (FD) reset by the reset transistor 143 to the select transistor 145 as a reset signal (reset level). The amplification transistor 144 also outputs the potential of the floating diffusion (FD) whose optical charges have been transferred by the read-out transistor 142 to the select transistor 145 as a light accumulation signal (signal level).

The select transistor 145 controls outputs of electric signals supplied from the amplification transistor 144 to a vertical signal line VSL. A drain electrode of the select transistor 145 is connected to the source electrode of the amplification transistor 144, and a source electrode thereof is connected to the vertical signal line VSL. Further, a control signal SEL is supplied to the gate electrode of the select transistor 145 from the pixel drive unit (not shown). When the control signal SEL (i.e., gate potential of select transistor 145) is off, the amplification transistor 144 and the vertical signal line VSL are electrically separated from each other. Therefore, in this state, a pixel signal is not output from the unit pixel. When the control signal SEL (i.e., gate potential of select transistor 145) is on, the unit pixel is in the selected state. In other words, a signal output from the amplification transistor 144 electrically connected to the vertical signal line VSL is supplied to the vertical signal line VSL as a pixel signal of the unit pixel. In other words, a pixel signal is read out from the unit pixel.

<Independency in Control of Each Processing>

Figure 4:
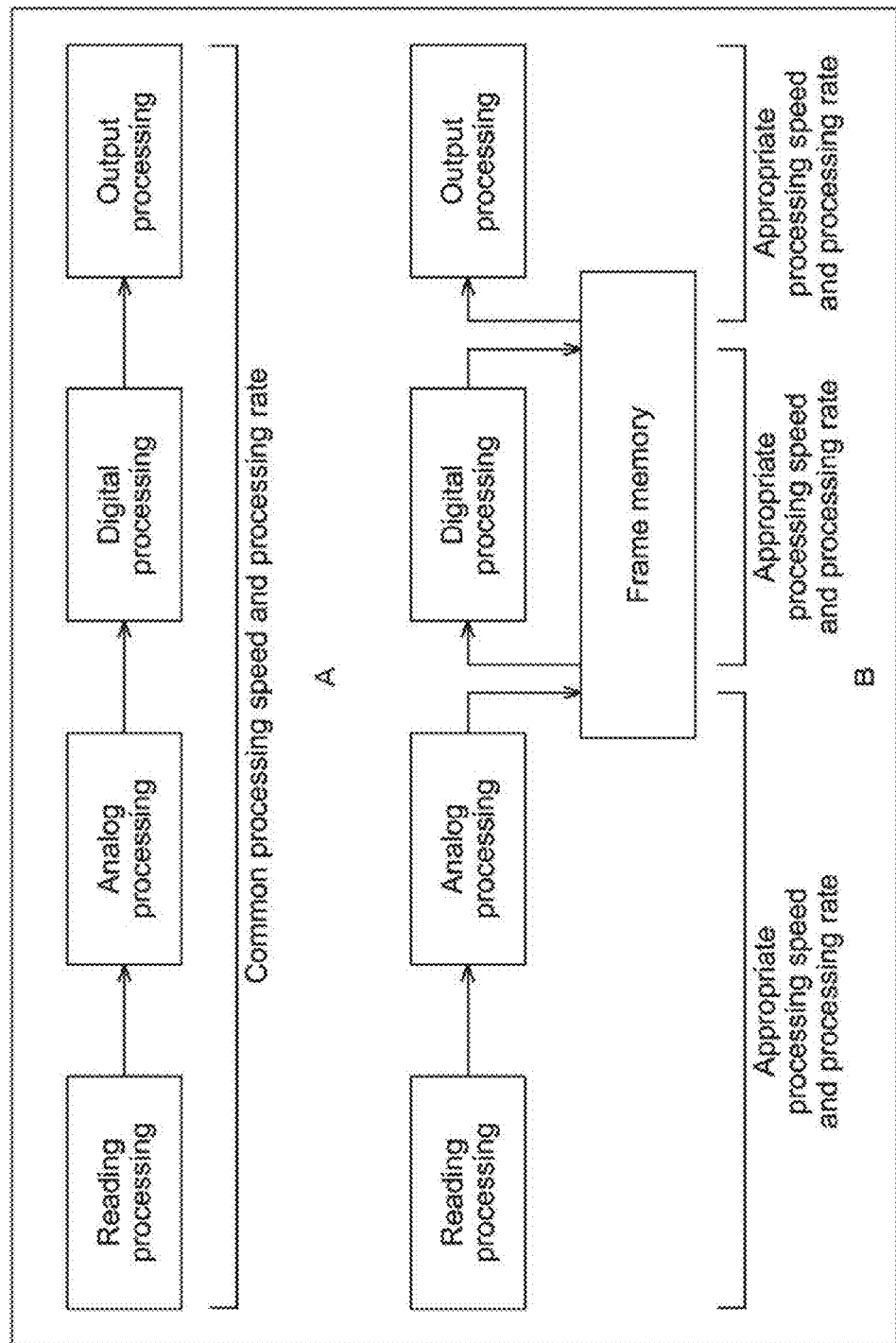
FIG. 4 Diagram for explaining how a processing speed and processing rate of each processing become independent.

As shown in FIG. 4A, in the image sensors of the related art, the digital processing as signal processing carried out on digital image data by the signal processing unit 122, the reading processing of reading out pixel signals by the pixel array unit 111, the analog processing as signal processing carried out on the analog pixel signals by the analog processing unit 112, and the output processing of outputting digital image data by the output unit 116 have been operated at a common processing speed and processing rate.

In contrast, as shown in FIG. 4B, the image sensor 100 includes the frame memory 115. By using the frame memory 115, the digital processing can be executed independent from the reading processing, the analog processing, and the output processing.

Therefore, the timing control unit 121 uses the frame memory 115 to execute the respective processing independently from one another in the image sensor 100 (execute flow control).

More specifically, the timing control unit 121 sets, for example, the processing speeds and processing rates (frame rates) of the reading processing, the analog processing, the digital processing, and the output processing independently from one another and causes the respective processing to be executed at the set processing speeds and processing rates.

It should be noted that hereinafter, for convenience in describing, a normal processing speed is referred to as medium speed, a speed faster than that is referred to as high speed, and a speed slower than that is referred to as low speed. Moreover, a normal processing rate (frame rate) is referred to as medium-speed rate, a processing rate faster than that is referred to as high-speed rate, and a processing rate slower than that is referred to as low-speed rate.

As a result, depending on the combination of the processing speeds and processing rates of the processing, the image sensor 100 can generate more diverse pickup images.

<Speed-Up of Reading/Analog Processing>

Hereinafter, a specific example of control of each processing by the timing control unit 121 will be described. For example, as shown in the example of FIG. 5, the timing control unit 121 may set the speeds of the reading processing and the analog processing to be higher than those of the digital processing and the output processing (executed at higher speed).

Figure 5:
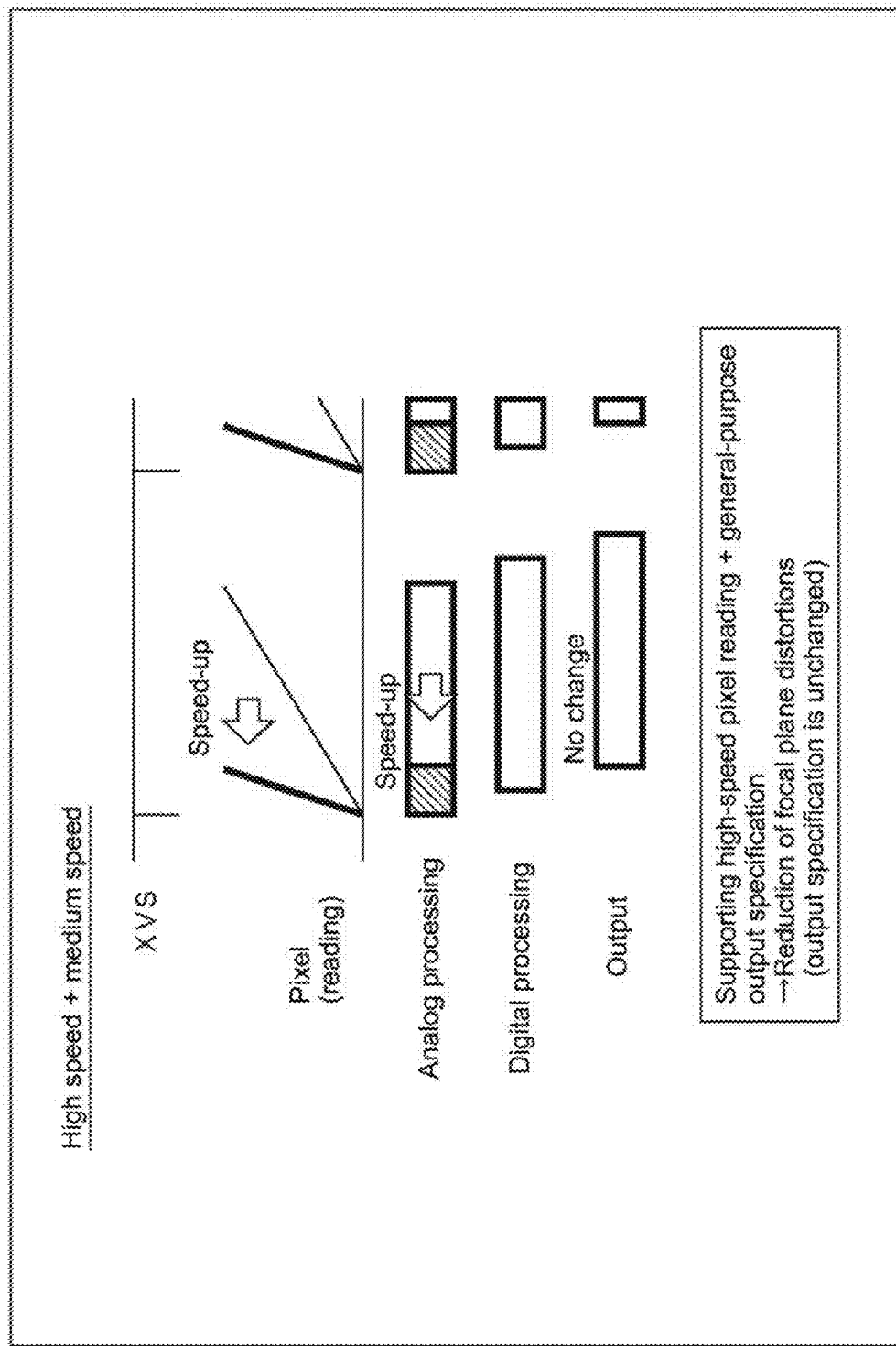
FIG. 5 A diagram showing an example of a control state.

FIG. 5 shows an example of a state of an operation period of each processing during a period in which processing for one frame is executed (vertical synchronization period XVS). As shown in FIG. 5, the reading processing and the analog processing are executed at a higher speed than the normal processing speed, and the digital processing and the output processing are executed at the normal processing speed. It should be noted that the processing rate (frame rate) of each processing is the same as the normal processing rate (processing rate is not changed).

As a result, speed-up of the reading processing and the analog processing can be realized without changing the output specification of the image sensor 100. By speeding up the reading processing and the analog processing, it becomes possible to reduce focal plane distortions as dynamic distortions that occur due to differences in reading times of respective rows of the pixel array. In other words, the digital processing and the output processing can reduce focal plane distortions without changing the output specification.

<Flow of Control Processing>

Figure 6:
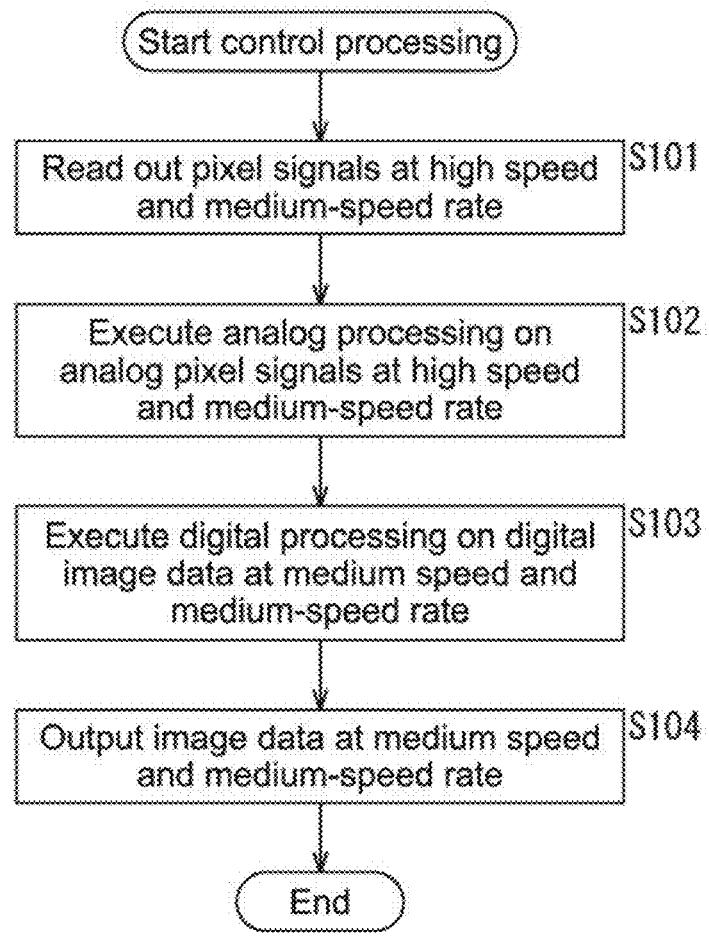
FIG. 6 A flowchart for explaining an example of a flow of control processing.

Next, with reference to FIG. 6, an example of a flow of control processing that is executed by the timing control unit 121 for controlling the operations of the respective processing as described above will be described.

As the control processing is started, in Step S101, the timing control unit 121 controls the operation of the pixel array unit 111 by, for example, supplying a control signal to the pixel array unit 111, to cause the pixels of the pixel array to photoelectrically convert incident light to read out pixel signals from the pixels. The timing control unit 121 causes the pixel array unit 111 to execute the reading processing at a high speed and a medium-speed rate.

In Step S102, the timing control unit 121 controls the operation of the analog processing unit 112 by, for example, supplying a control signal to the analog processing unit 112, to cause the analog processing unit 112 to carry out analog processing such as an A/D conversion on the analog pixel signals obtained at a high speed under control of Step S101. The timing control unit 121 causes the analog processing unit 112 to execute the analog processing at a high speed and a medium-speed rate.

In Step S103, the timing control unit 121 controls the operation of the signal processing unit 122 by, for example, supplying a control signal to the signal processing unit 122, to cause the signal processing unit 122 to carry out digital processing on digital image data obtained at a high speed under control of Step S102. The timing control unit 121 causes the signal processing unit 122 to execute the digital processing at a medium speed and a medium-speed rate.

In Step S104, the timing control unit 121 controls the operation of the output unit 116 by, for example, supplying a control signal to the output unit 116, to cause the output unit 116 to output image data subjected to the digital processing at a medium speed under control of Step S103. The timing control unit 121 causes the output unit 116 to execute the output processing at a medium speed and a medium-speed rate.

Upon completing the processing of Step S104, the control processing is ended.

The digital image data obtained by the analog processing carried out under control of Step S102 is stored in the frame memory 115. Therefore, even when the reading processing and the analog processing are executed at a high speed, the digital processing and the output processing can be executed at a slower medium speed. By the timing control unit 121 executing the control processing as described above using this fact, the image sensor 100 can reduce focal plane distortions without changing the output specification.

<Speed-Down of Digital Processing>

Further, for example, the reading processing and the analog processing may be executed at a high speed as in the example shown in FIG. 5, and the speed of the digital processing may be set to be lower than that of the output processing (execute at lower speed).

Figure 7:
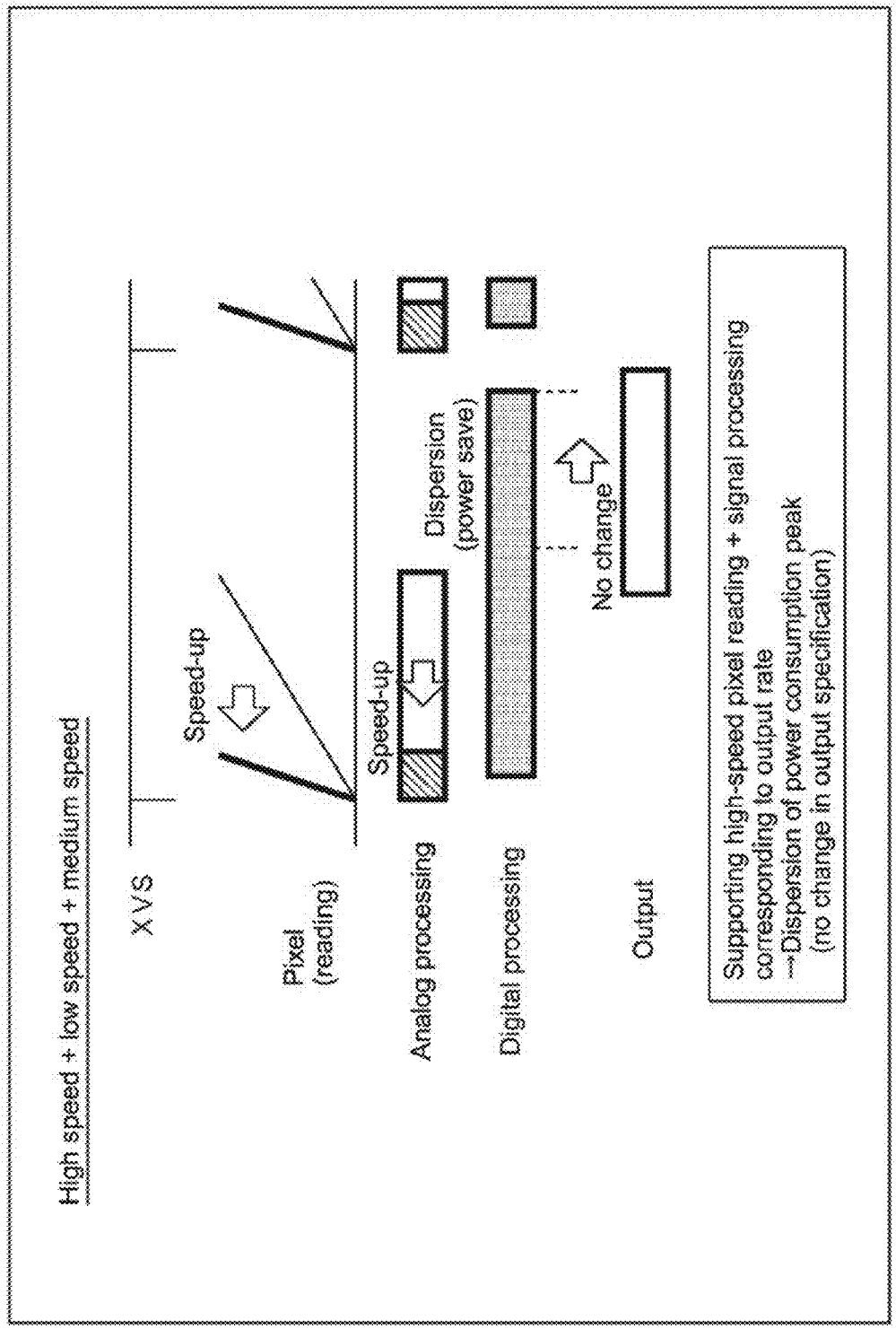
FIG. 7 A diagram showing an example of the control state.

As in FIG. 5, FIG. 7 shows an example of a state of an operation period of each processing during the period in which processing for one frame is executed (vertical synchronization period XVS). As shown in FIG. 7, the reading processing and the analog processing are executed at a higher speed than the normal processing speed, the digital processing is executed at a lower speed than the normal processing speed, and the output processing is executed at the normal processing speed. It should be noted that the processing rate (frame rate) of each processing is the same as the normal processing rate (processing rate is not changed).

As a result, it becomes possible to speed up the reading processing and the analog processing and speed down the digital processing without changing the output specification of the image sensor 100. By speeding up the reading processing and the analog processing, the focal plane distortions can be reduced. Moreover, by speeding down the digital processing, the processing time of the digital processing is prolonged, and loads of the digital processing are dispersed. As a result, it becomes possible to suppress concentration of power consumption timings and smoothen fluctuations of power consumption. In other words, a peak value of power consumption (maximum value) can be reduced. Accordingly, a margin of power consumption can be enlarged. In other words, the image sensor 100 can reduce focal plane distortions and enlarge a power consumption margin without changing the output specification.

<Flow of Control Processing>

Figure 8:
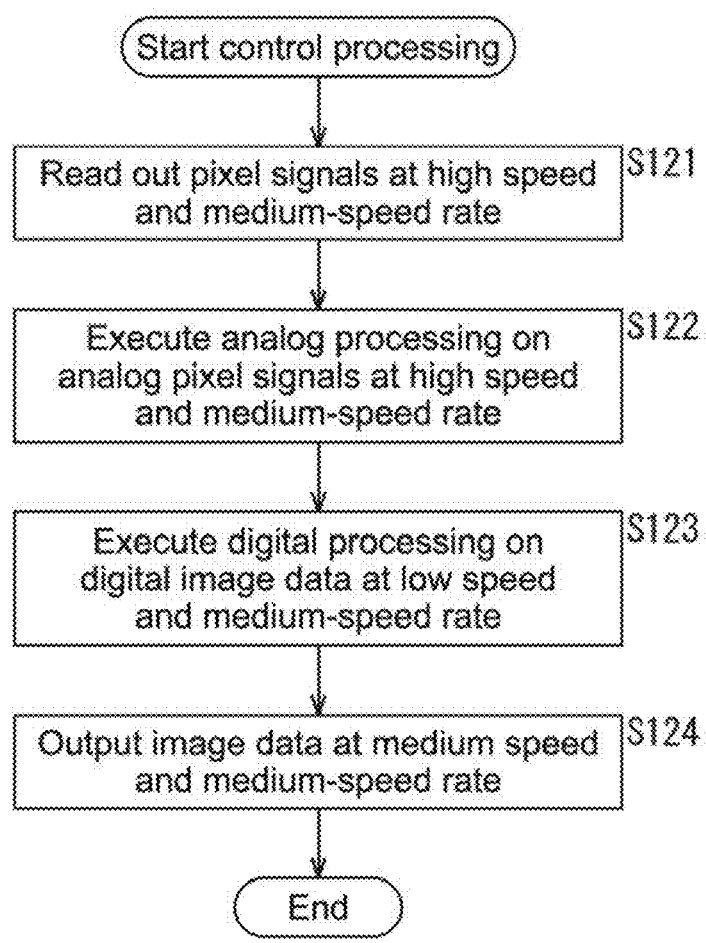
FIG. 8 A flowchart for explaining an example of the flow of the control processing.

Next, with reference to the flowchart of FIG. 8, an example of the flow of control processing that is executed by the timing control unit 121 for controlling the operations of the respective processing as described above will be described.

As the control processing is started, in Step S121, the timing control unit 121 controls the operation of the pixel array unit 111 by, for example, supplying a control signal to the pixel array unit 111, to cause the pixels of the pixel array to photoelectrically convert incident light to read out pixel signals from the pixels. The timing control unit 121 causes the pixel array unit 111 to execute the reading processing at a high speed and a medium-speed rate.

In Step S122, the timing control unit 121 controls the operation of the analog processing unit 112 by, for example, supplying a control signal to the analog processing unit 112, to cause the analog processing unit 112 to carry out analog processing such as an A/D conversion on the analog pixel signals obtained at a high speed under control of Step S121. The timing control unit 121 causes the analog processing unit 112 to execute the analog processing at a high speed and a medium-speed rate.

In Step S123, the timing control unit 121 controls the operation of the signal processing unit 122 by, for example, supplying a control signal to the signal processing unit 122, to cause the signal processing unit 122 to carry out digital processing on digital image data obtained at a high speed under control of Step S102. The timing control unit 121 causes the signal processing unit 122 to execute the digital processing at a low speed and a medium-speed rate.

In Step S124, the timing control unit 121 controls the operation of the output unit 116 by, for example, supplying a control signal to the output unit 116, to cause the output unit 116 to output image data subjected to the digital processing at a low speed under control of Step S123. The timing control unit 121 causes the output unit 116 to execute the output processing at a medium speed and a medium-speed rate.

Upon completing the processing of Step S124, the control processing is ended.

The digital image data obtained by the analog processing carried out under control of Step S122 is stored in the frame memory 115. Therefore, even when the reading processing and the analog processing are executed at a high speed, the digital processing can be executed at a lower speed. The image data subjected to the digital processing is also stored in the frame memory 115. Therefore, the output processing can be executed at a medium speed faster than in the digital processing. By the timing control unit 121 executing the control processing as described above using this fact, the image sensor 100 can reduce focal plane distortions and enlarge the power consumption margin without changing the output specification.

<Executing Digital Processing Plurality of Times>

Figure 9:
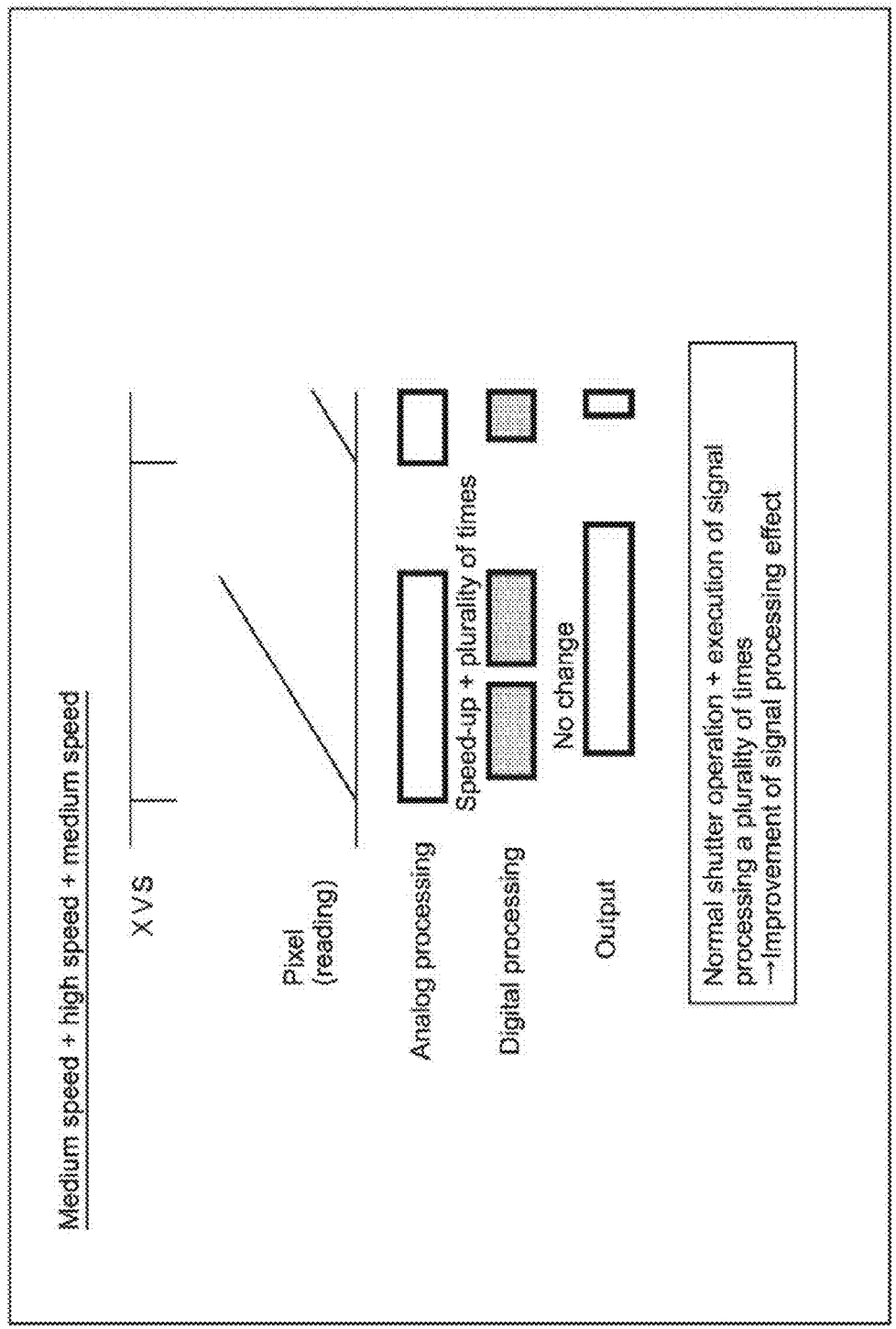
FIG. 9 A diagram showing an example of the control state.

Further, for example, as in the example shown in FIG. 9, the processing speed of the digital processing may be set to be higher than those of the reading processing, the analog processing, and the output processing (execute at higher speed), and the digital processing may be repeated a plurality of times (execute digital processing plurality of times).

As in FIG. 5, FIG. 9 shows an example of the state of the operation period of each processing during the period in which processing for one frame is executed (vertical synchronization period XVS). As shown in FIG. 9, the reading processing, the analog processing, and the output processing are executed at a normal processing speed. In contrast, the digital processing is executed at a higher speed than the normal processing speed, and the digital processing is executed a plurality of times. It should be noted that the processing rate (frame rate) of each processing is the same as the normal processing rate (processing rate is not changed).

As a result, the digital processing (digital signal processing) can be applied a plurality of times without changing the output specification of the image sensor 100. By applying the digital processing a plurality of times, the signal processing effect can be enhanced. For example, by applying filter processing or the like a plurality of times, the filter processing effect can be more strongly reflected on the image data. Furthermore, for example, it is possible to execute scaling processing of converting a resolution or aspect ratio a plurality of times, generate a target having a different resolution or aspect ratio in addition to that for an output, and carry out detection processing a plurality of times, to thus improve detection accuracy.

In other words, the image sensor 100 can enhance the signal processing (digital processing) effect without changing the output specification.

<Flow of Control Processing>

Figure 10:
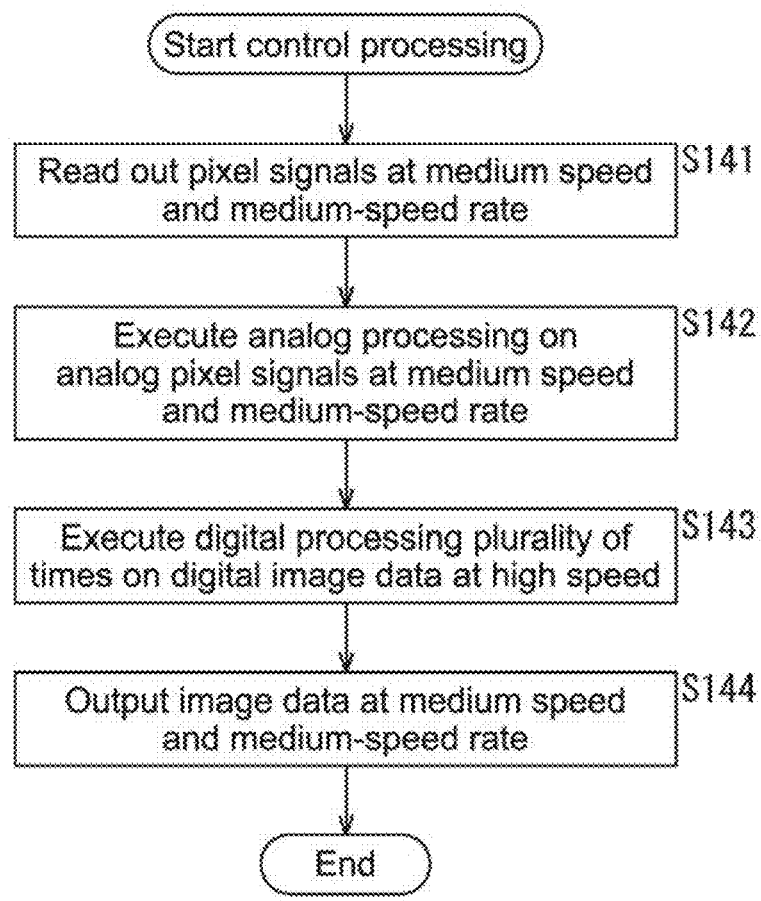
FIG. 10 A flowchart for explaining an example of the flow of the control processing.

Next, with reference to the flowchart of FIG. 10, an example of the flow of control processing that is executed by the timing control unit 121 for controlling the operations of the respective processing as described above will be described.

As the control processing is started, in Step S141, the timing control unit 121 controls the operation of the pixel array unit 111 by, for example, supplying a control signal to the pixel array unit 111, to cause the pixels of the pixel array to photoelectrically convert incident light to read out pixel signals from the pixels. The timing control unit 121 causes the pixel array unit 111 to execute the reading processing at a medium speed and a medium-speed rate.

In Step S142, the timing control unit 121 controls the operation of the analog processing unit 112 by, for example, supplying a control signal to the analog processing unit 112, to cause the analog processing unit 112 to carry out analog processing such as an A/D conversion on the analog pixel signals obtained at a medium speed under control of Step S141. The timing control unit 121 causes the analog processing unit 112 to execute the analog processing at a medium speed and a medium-speed rate.

In Step S143, the timing control unit 121 controls the operation of the signal processing unit 122 by, for example, supplying a control signal to the signal processing unit 122, to cause the signal processing unit 122 to carry out digital processing on digital image data obtained at a medium speed under control of Step S142. The timing control unit 121 causes the signal processing unit 122 to execute the digital processing a plurality of times at a high speed and a high-speed rate.

In Step S144, the timing control unit 121 controls the operation of the output unit 116 by, for example, supplying a control signal to the output unit 116, to cause the output unit 116 to output image data subjected to the digital processing a plurality of times at a high speed under control of Step S143. The timing control unit 121 causes the output unit 116 to execute the output processing at a medium speed and a medium-speed rate.

Upon completing the processing of Step S144, the control processing is ended.

The digital image data obtained by the analog processing carried out under control of Step S142 is stored in the frame memory 115. Therefore, even when the reading processing and the analog processing are executed at a medium speed, the digital processing can be executed at a higher speed. The digital processing can also be executed a plurality of times. The image data subjected to the digital processing is also stored in the frame memory 115. Therefore, the output processing can be executed at a medium speed slower than in the digital processing. By the timing control unit 121 executing the control processing as described above using this fact, the image sensor 100 can enhance the signal processing (digital processing) effect without changing the output specification.

<Control of Processing Rate>

Further, the processing rates of the processing may also be changed. For example, as in the example shown in FIG. 11, the processing speeds and processing rates of the reading processing and the analog processing may be set to be higher than those of the digital processing and the output processing (execute at higher speed) (raise frame rates).

Figure 11:
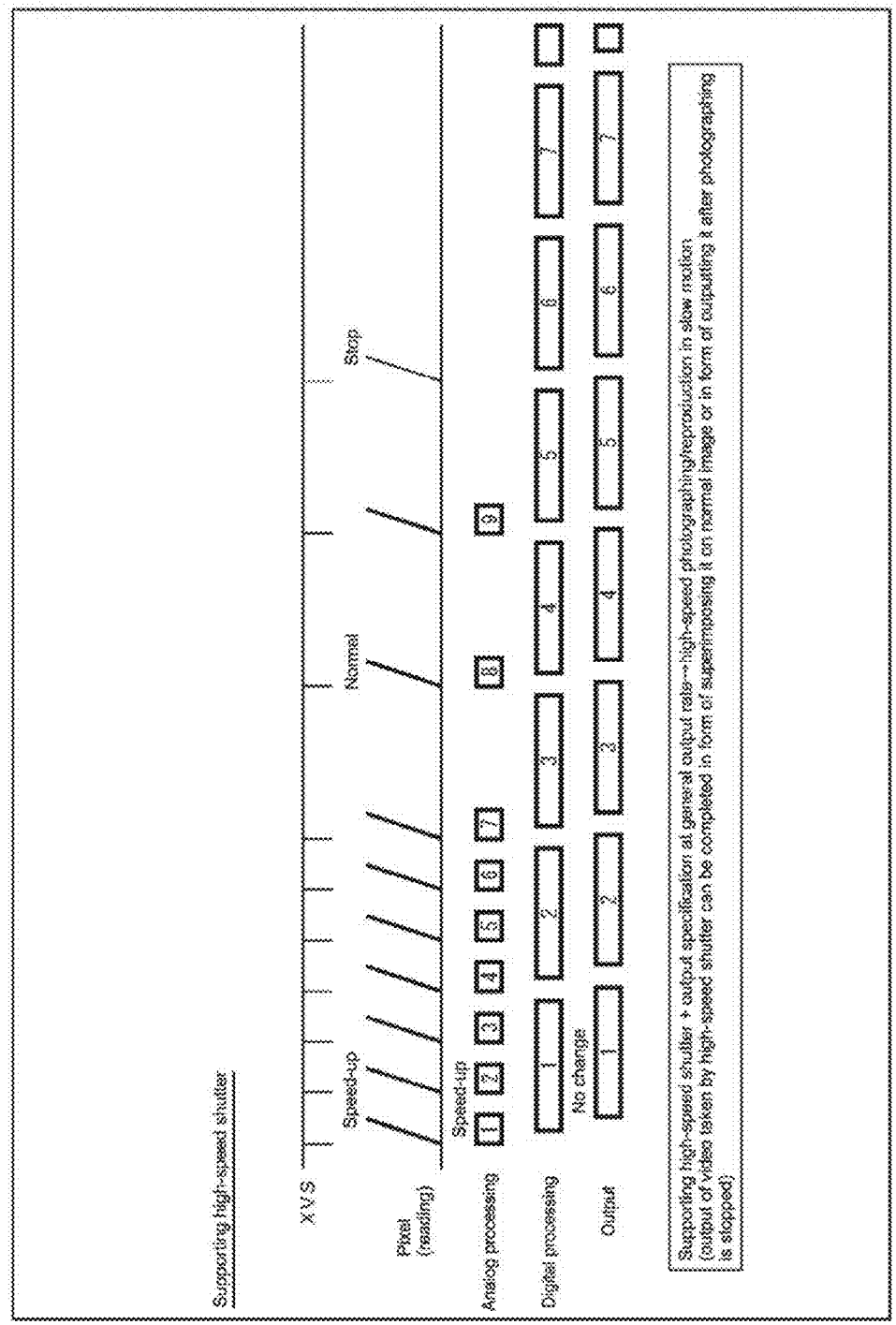
FIG. 11 A diagram showing an example of the control state.

FIG. 11 shows an example of the state of the operation period of each processing during the period in which processing is executed for a plurality of frames (vertical synchronization period XVS). As shown in FIG. 11, the reading processing and the analog processing are executed at a higher speed than the normal processing speed, and the digital processing and the output processing are executed at a normal processing speed. Moreover, the reading processing and the analog processing are executed at a higher processing rate than the normal processing rate, and the digital processing and the output processing are executed at a normal processing rate.

As a result, the processing speeds and processing rates of the reading processing and the analog processing can be set high without changing the output specification of the image sensor 100. By setting the processing speeds and processing rates of the reading processing and the analog processing to be high, high-speed photographing can be realized. Moreover, by executing the digital processing and the output processing at the normal processing speed and processing rate, images photographed at a high speed can be reproduced in slow motion. In other words, the image sensor 100 can realize high-speed photographing or reproduction in slow motion without changing the output specification.

<Flow of Control Processing>

Figure 12:
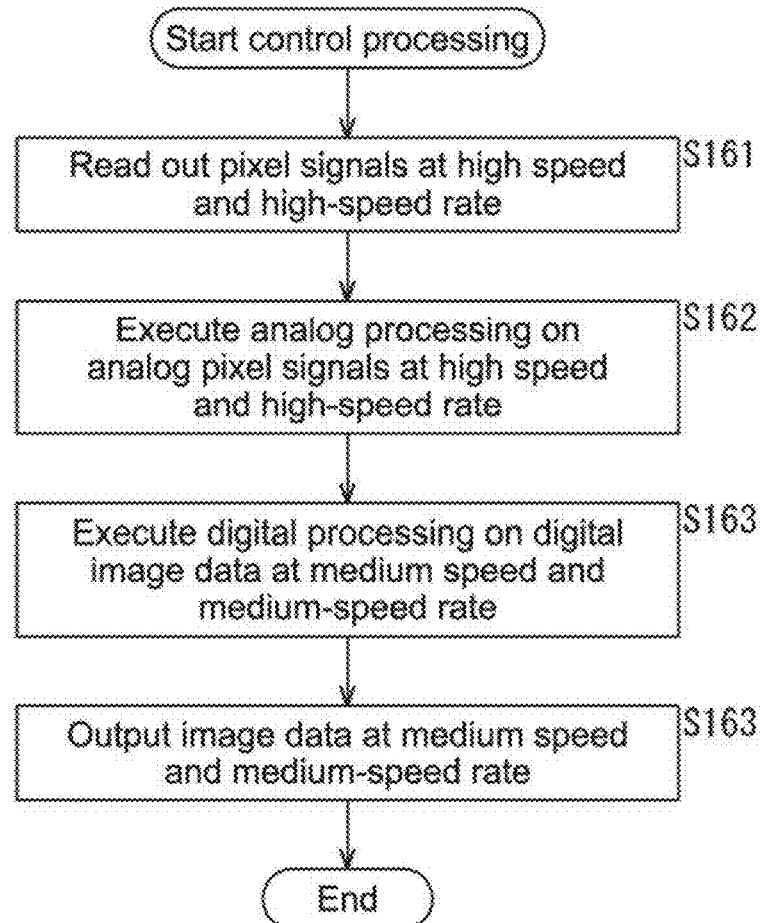
FIG. 12 A flowchart for explaining an example of the flow of the control processing.

Next, with reference to the flowchart of FIG. 12, an example of the flow of control processing that is executed by the timing control unit 121 for controlling the operations of the respective processing as described above will be described.

As the control processing is started, in Step S161, the timing control unit 121 controls the operation of the pixel array unit 111 by, for example, supplying a control signal to the pixel array unit 111, to cause the pixels of the pixel array to photoelectrically convert incident light to read out pixel signals from the pixels. The timing control unit 121 causes the pixel array unit 111 to execute the reading processing at a high speed and a high-speed rate.

In Step S162, the timing control unit 121 controls the operation of the analog processing unit 112 by, for example, supplying a control signal to the analog processing unit 112, to cause the analog processing unit 112 to carry out analog processing such as an A/D conversion on the analog pixel signals obtained at a medium speed under control of Step S161. The timing control unit 121 causes the analog processing unit 112 to execute the analog processing at a high speed and a high-speed rate.

In Step S163, the timing control unit 121 controls the operation of the signal processing unit 122 by, for example, supplying a control signal to the signal processing unit 122, to cause the signal processing unit 122 to carry out digital processing on digital image data obtained at a high speed and a high-speed rate under control of Step S162. The timing control unit 121 causes the signal processing unit 122 to execute the digital processing at a medium speed and a medium-speed rate.

In Step S164, the timing control unit 121 controls the operation of the output unit 116 by, for example, supplying a control signal to the output unit 116, to cause the output unit 116 to output image data subjected to the digital processing at a medium speed and a medium-speed rate under control of Step S163. The timing control unit 121 causes the output unit 116 to execute the output processing at a medium speed and a medium-speed rate.

Upon completing the processing of Step S164, the control processing is ended.

The digital image data obtained by the analog processing carried out under control of Step S162 is stored in the frame memory 115. Therefore, even when the reading processing and the analog processing are executed at a high speed and a high-speed rate, the digital processing and the output processing can be executed at a slower medium speed and medium-speed rate. By the timing control unit 121 executing the control processing as described above using this fact, the image sensor 100 can realize high-speed photographing and reproduction in slow motion without changing the output specification.

It should be noted that the number of frames that can be photographed at a higher processing rate than the normal processing rate and reproduced at the normal processing rate depends on the capacity of the frame memory 115. By the photographing as described above, image data is accumulated in the frame memory 115 for an amount corresponding to the difference between the processing rate of the reading processing and the analog processing and the processing rate of the digital processing and the output processing. Since the capacity of the frame memory 115 is finite though arbitrary, there is also a limit in the absorption of the rate difference. In other words, the photographing as described above can be performed only within the range of the capacity of the frame memory 115.

It should be noted that when a free space of the frame memory 115 is insufficient, the photographing may be set back to the normal processing rate like the frames 8 and 9 shown in FIG. 11. In other words, the processing rates of the reading processing and the analog processing, that have been executed at a high-speed rate, may be changed to a medium-speed rate.

Further, when temporarily performing high-speed photographing while photographing at a normal processing rate, images taken during high-speed photographing may be output subsequent to the images photographed at the normal processing rate, or may be output while being superimposed in images taken at the normal processing rate like a so-called picture-in-picture, or may be output separately after photographing is stopped.

<2. Second Embodiment>

<Time Shift>

It should be noted that by using the frame memory 115, it is possible to not only change the processing speeds and processing rates of the processing as described above but also change processing-target frames of the respective processing in a time direction (i.e., processing-target frames of respective processing can be set independent from one another).

Figure 13:
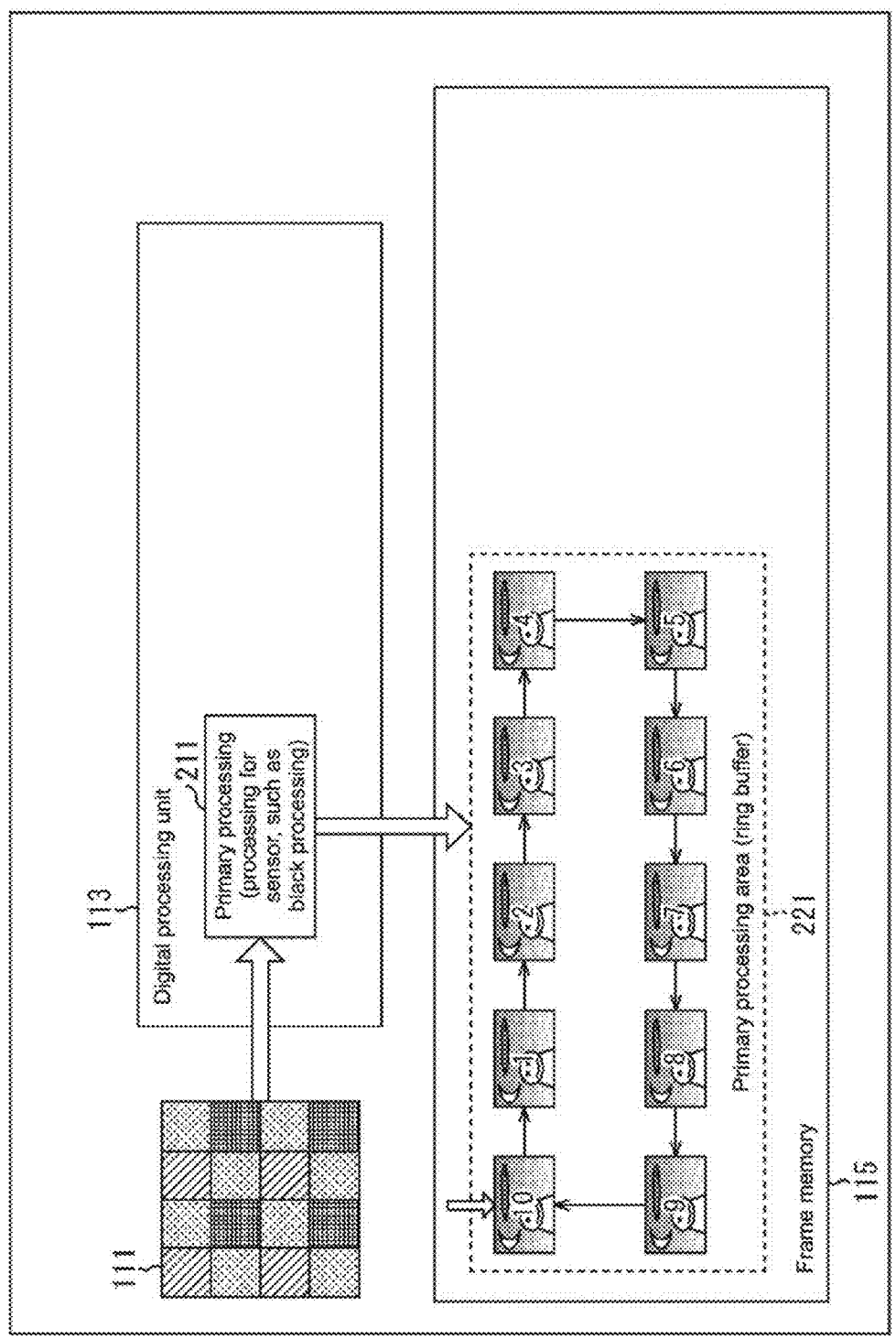
FIG. 13 A diagram showing an example of the control state.

For example, as shown in FIG. 13, a ring buffer may be provided in the frame memory 115. In this case, image data read out from the pixel array unit 111 and subjected to the A/D conversion is subjected to primary processing 211 of a sensor function such as pixel rearrangement processing and black level processing by the digital processing unit 113. The image data subjected to the primary processing 211 is stored in a primary processing area 221 provided inside the frame memory 115. The primary processing area 221 forms the ring buffer and successively stores the image data of each frame that has been supplied from the digital processing unit 113 after being subjected to the primary processing 211.

Pieces of image data of captured images as pickup images obtained by the pixel array unit 111 in a state where a user has not pressed a photographing button or the like, that is, photographing is not instructed, are successively stored in the primary processing area 221 as the ring buffer as described above.

Figure 14:
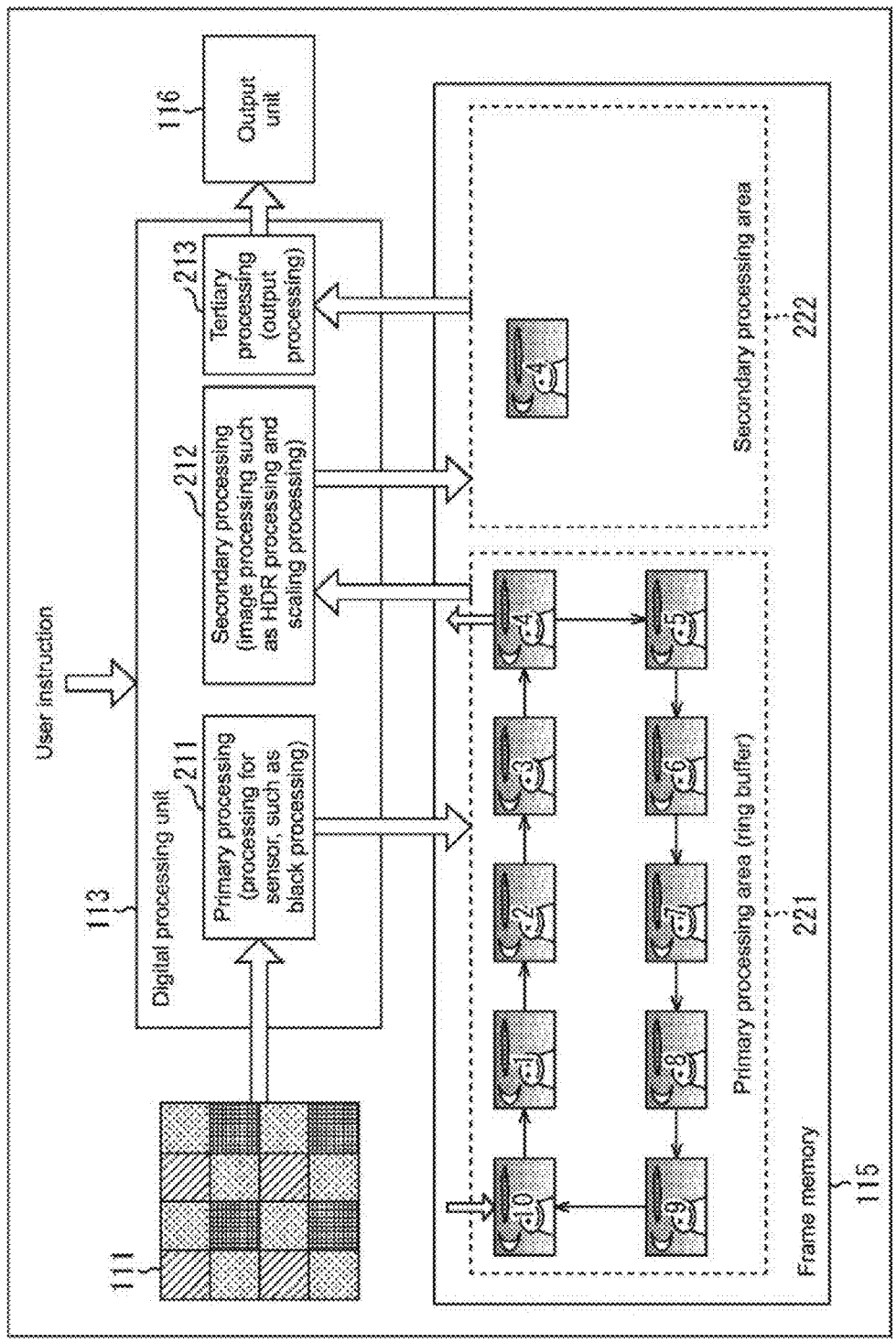
FIG. 14 A diagram showing an example of the control state.

For example, when the user instructs photographing by pressing a photographing button or the like as shown in FIG. 14, the digital processing unit 113 reads out image data of a past frame that is stored in the primary processing area 221 based on the user instruction. Regarding the image data stored in the primary processing area 221, the frame stored last is the newest frame. The digital processing unit 113 reads out the image data from the past frame stored temporally before the newest frame.

How many frames from the newest frame the frame of the image data read out by the digital processing unit 113 is, is arbitrary. For example, the digital processing unit 113 may read out image data of a frame obtained several minutes before the newest frame, the several minutes being a predetermined value, or read out image data stored at a predetermined position excluding a position where the image of the newest frame is stored in the primary processing area 221 as the ring buffer.

The digital processing unit 113 carries out secondary processing 212 of image processing such as HDR (High Dynamic Range) processing and scaling processing of converting a resolution or aspect ratio, on the readout image data. The image data subjected to the secondary processing 212 is stored in a secondary processing area 222 provided inside the frame memory 115.

The digital processing unit 113 carries out output control processing 213 to read out image data stored in the secondary processing area 222 at predetermined timings and supplies the image data to the output unit 116 to cause it to output the image data.

As described above, by using the ring buffer, the image sensor 100 can output data of the past.

<Flow of Control Processing>

Figure 15:
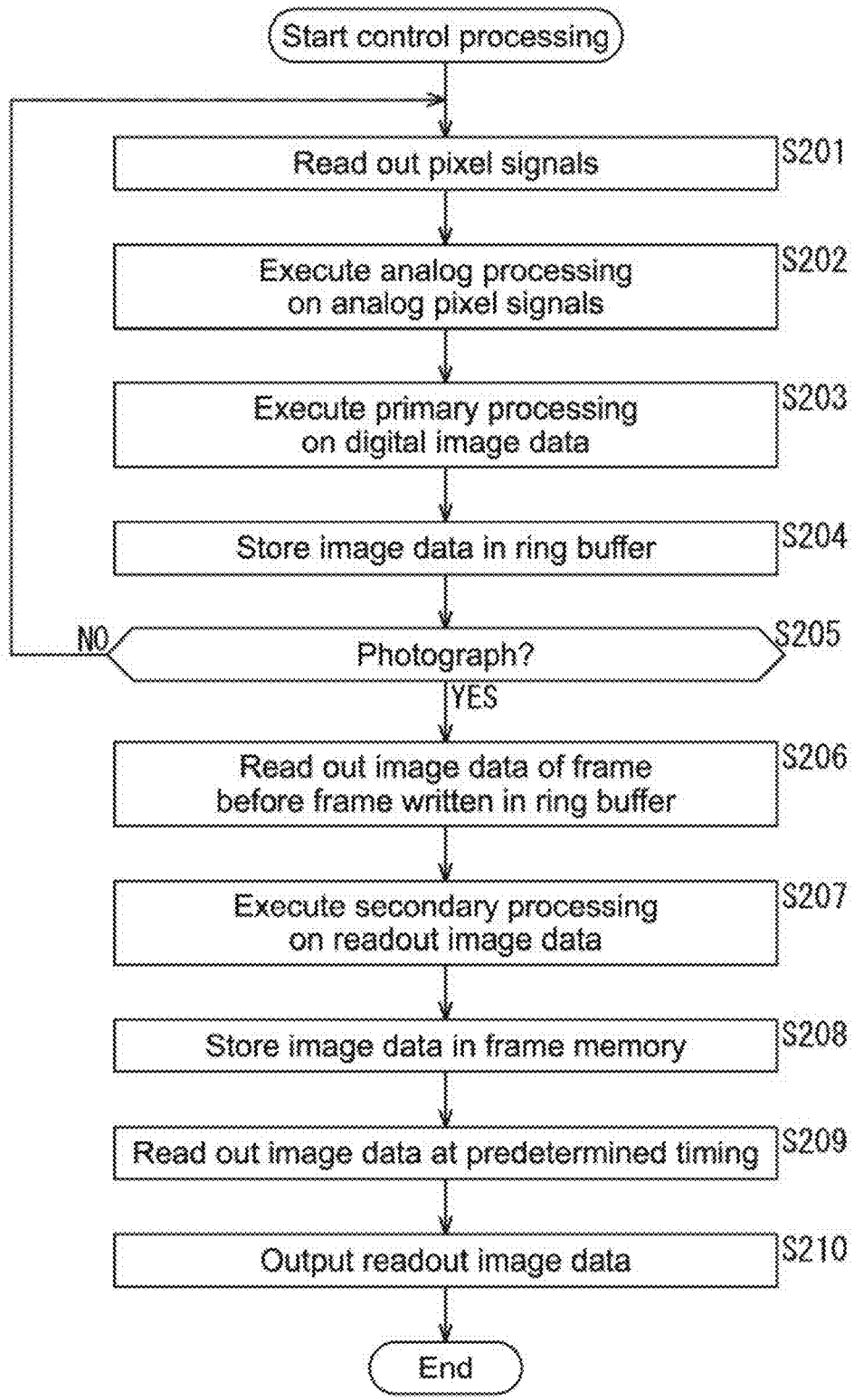
FIG. 15 A flowchart for explaining an example of the flow of the control processing.

An example of the flow of the control processing in this case will be described with reference to the flowchart of FIG. 15.

As the control processing is started, in Step S201, the timing control unit 121 controls the operation of the pixel array unit 111 by, for example, supplying a control signal to the pixel array unit 111, to cause the pixels of the pixel array to photoelectrically convert incident light to read out pixel signals from the pixels.

In Step S202, the timing control unit 121 controls the operation of the analog processing unit 112 by, for example, supplying a control signal to the analog processing unit 112, to cause the analog processing unit 112 to carry out analog processing such as an A/D conversion on the analog pixel signals obtained under control of Step S201.

In Step S203, the timing control unit 121 controls the operation of the signal processing unit 122 by, for example, supplying a control signal to the signal processing unit 122, to cause the signal processing unit 122 to carry out the primary processing on digital image data obtained under control of Step S202.

In Step S204, the timing control unit 121 controls the operation of the signal processing unit 122 by, for example, supplying a control signal to the signal processing unit 122, to cause the signal processing unit 122 to store the image data subjected to the primary processing under control of Step S202 in the ring buffer (primary processing area 221) of the frame memory 115.

In Step S205, the timing control unit 121 judges whether to pick up images. For example, when an image pickup instruction is not input from a user or the like and it is judged that images are not to be taken, the processing returns to Step S201, and the subsequent processing are repeated. Specifically, in the state before photographing, the processing of Steps S201 to S205 are repetitively executed, and captured images are stored in the primary processing area 221.

When the user operates the photographing button or the like to input an image pickup instruction and it is judged that images are to be taken in Step S205, the processing advances to Step S206.

In Step S206, the timing control unit 121 controls the operation of the signal processing unit 122 by, for example, supplying a control signal to the signal processing unit 122, to cause the signal processing unit 122 to read out image data of a frame before the newest frame (past frame) that has been written in the ring buffer (primary processing area 221) of the frame memory 115.

In Step S207, the timing control unit 121 controls the operation of the signal processing unit 122 by, for example, supplying a control signal to the signal processing unit 122, to cause the signal processing unit 122 to carry out the secondary processing on the image data read out under control of Step S206.

In Step S208, the timing control unit 121 controls the operation of the signal processing unit 122 by, for example, supplying a control signal to the signal processing unit 122, to cause the signal processing unit 122 to store the image data subjected to the secondary processing under control of Step S207 in the secondary processing area 222 of the frame memory 115.

In Step S209, the timing control unit 121 controls the operation of the signal processing unit 122 by, for example, supplying a control signal to the signal processing unit 122, to cause the signal processing unit 122 to carry out the tertiary processing. Specifically, the signal processing unit 122 carries out the tertiary processing under control of the timing control unit 121 to read out the image data stored in the secondary processing area 222 of the frame memory 115 at predetermined timings under control of Step S208.

In Step S210, the timing control unit 121 controls the operation of the output unit 116 by, for example, supplying a control signal to the output unit 116, to cause the output unit 116 to output the image data read out under control of Step S209 to an apparatus outside the image sensor 100.

Upon completing the processing of Step S210, the control processing is ended.

By carrying out the processing as described above, the image sensor 100 can output past data using the ring buffer.

The image sensor 100 as described above is applicable to an arbitrary apparatus or system but is favorably applied to a drive recorder that records, at a time of an accident, a video from a little before the accident, a security camera that detects movements of people and animals and records a video from a little before the detection, and the like.

<Example of Time Shift>

Figure 16:
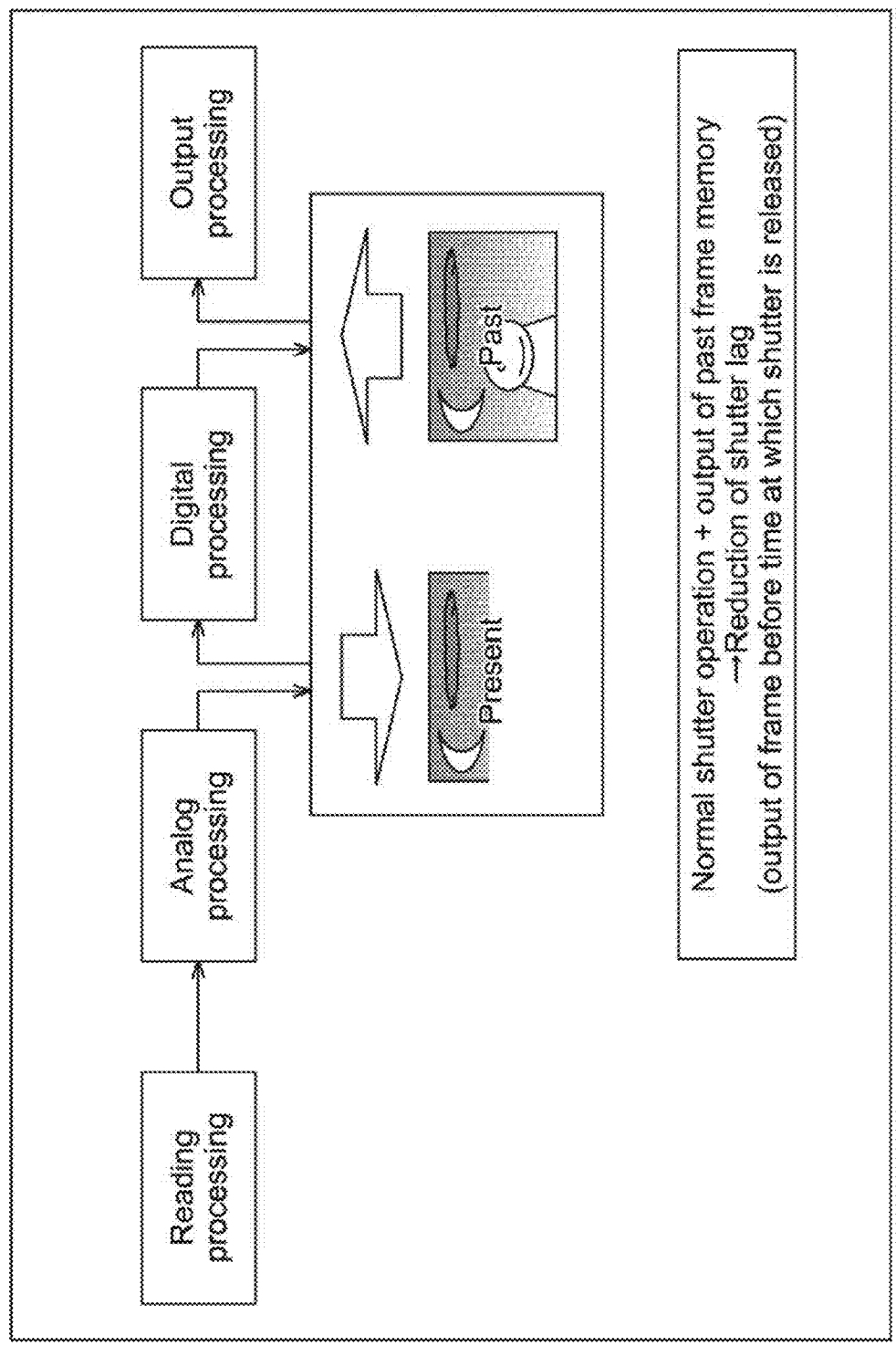
FIG. 16 A diagram showing an example of the control state.

It should be noted that past data may be output without using the ring buffer. For example, the frame memory 115 only needs to have enough capacity to store image data of a plurality of frames. For example, data stored in the frame memory 115 may be read out by a FIFO (First In First Out) system. An example of this case is shown in FIG. 16. In the case of the example shown in FIG. 16, since the frame memory 115 operates as FIFO, the signal processing unit 122 reads out image data of a frame temporally before the newest frame (past frame) that is currently being stored in the frame memory 115.

For example, in the case where a pickup image can be obtained as the user operates the photographing button and photographs an object, a predetermined processing time is necessary before image data of the pickup image is output since the user presses the photographing button, and thus a delay occurs that much. When the delay time is large, there is a fear that it will become difficult for the user to obtain a pickup image at a desired timing.

In this regard, as in the example shown in FIG. 16, by carrying out the digital processing on an image of a frame temporally before the pickup image obtained as the user operates the photographing button and outputting it as a pickup image, the image sensor 100 can suppress an increase of the delay time (time lag).

It should be noted that the image data may either be a moving image or a still image.

<Flow of Control Processing>

Figure 17:
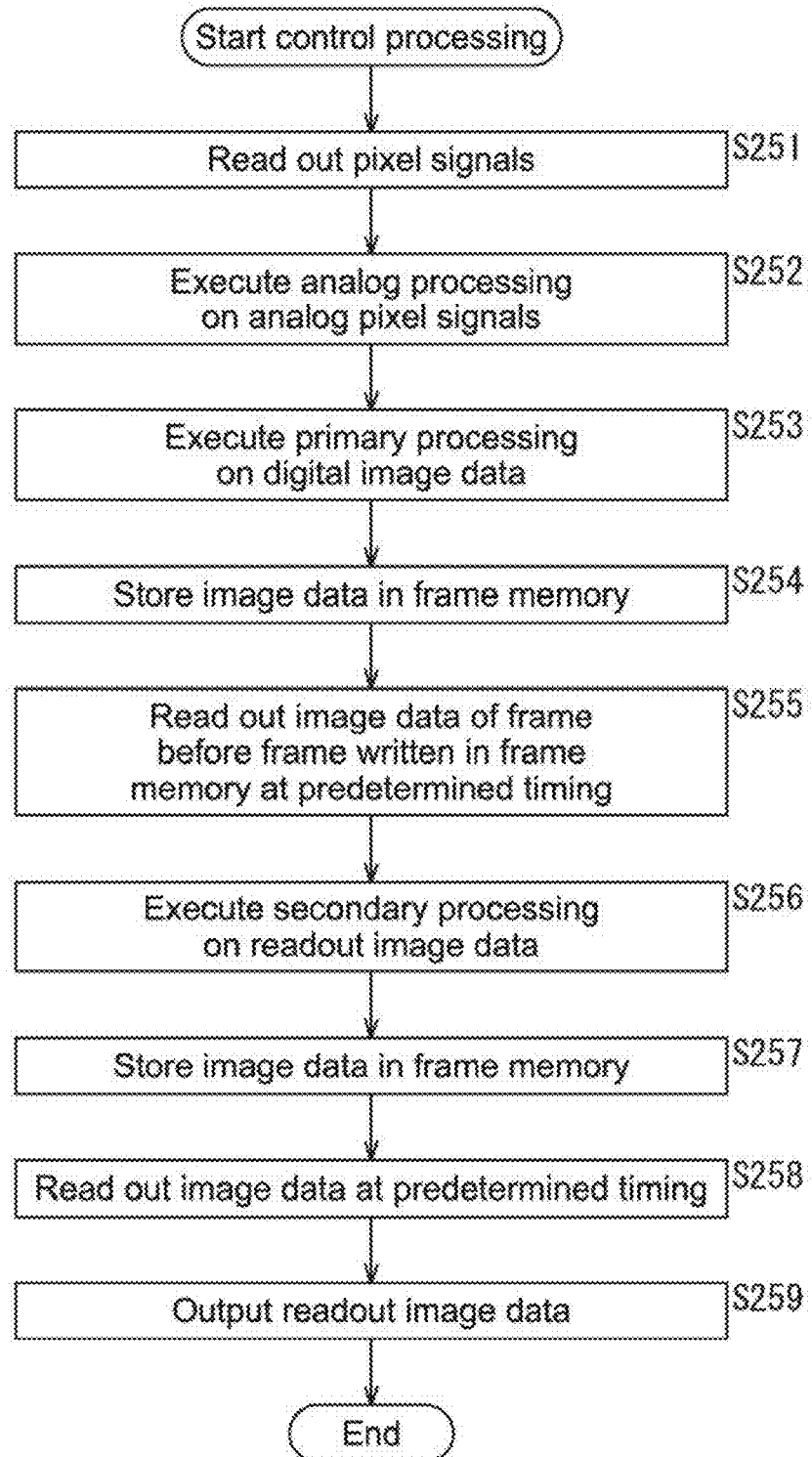
FIG. 17 A flowchart for explaining an example of the flow of the control processing.

An example of the flow of the control processing in this case will be described with reference to the flowchart of FIG. 17.

As the control processing is started, in Step S251, the timing control unit 121 controls the operation of the pixel array unit 111 by, for example, supplying a control signal to the pixel array unit 111, to cause the pixels of the pixel array to photoelectrically convert incident light to read out pixel signals from the pixels.

In Step S252, the timing control unit 121 controls the operation of the analog processing unit 112 by, for example, supplying a control signal to the analog processing unit 112, to cause the analog processing unit 112 to carry out analog processing such as an A/D conversion on the analog pixel signals obtained under control of Step S251.

In Step S253, the timing control unit 121 controls the operation of the signal processing unit 122 by, for example, supplying a control signal to the signal processing unit 122, to cause the signal processing unit 122 to carry out the primary processing on digital image data obtained under control of Step S252.

In Step S254, the timing control unit 121 controls the operation of the signal processing unit 122 by, for example, supplying a control signal to the signal processing unit 122, to cause the signal processing unit 122 to store the image data subjected to the primary processing under control of Step S252 in the frame memory 115.

In Step S255, at a predetermined timing such as a timing at which the user or the like inputs an image pickup instruction, the timing control unit 121 controls the operation of the signal processing unit 122 by, for example, supplying a control signal to the signal processing unit 122, to cause the signal processing unit 122 to read out image data of a frame before the frame written in the frame memory 115 (past frame).

In Step S256, the timing control unit 121 controls the operation of the signal processing unit 122 by, for example, supplying a control signal to the signal processing unit 122, to cause the signal processing unit 122 to carry out the secondary processing on the image data read out under control of Step S255.

In Step S257, the timing control unit 121 controls the operation of the signal processing unit 122 by, for example, supplying a control signal to the signal processing unit 122, to cause the signal processing unit 122 to store the image data subjected to the secondary processing under control of Step S256 in the frame memory 115.

In Step S258, the timing control unit 121 controls the operation of the signal processing unit 122 by, for example, supplying a control signal to the signal processing unit 122, to cause the signal processing unit 122 to carry out the tertiary processing. Specifically, the signal processing unit 122 carries out the tertiary processing under control of the timing control unit 121 to read out the image data stored in the frame memory 115 at predetermined timings under control of Step S257.

In Step S259, the timing control unit 121 controls the operation of the output unit 116 by, for example, supplying a control signal to the output unit 116, to cause the output unit 116 to output the image data read out under control of Step S258 to an apparatus outside the image sensor 100.

Upon completing the processing of Step S259, the control processing is ended.

By carrying out the processing as described above, the image sensor 100 can output past data and suppress an increase of the delay time (time lag) before image data is output since a photographing instruction is input.

The image sensor 100 as described above is applicable to an arbitrary apparatus or system but is favorably applied to, for example, a digital camera and a video camera that capture an object as a user operates the photographing button.

<3. Third Embodiment>

<Physical Structure of Image Sensor>

It should be noted that the image pickup device to which the present technique is applied can be realized as a sealed package, a module in which a package is mounted on a circuit board, and the like. For example, when realizing the image pickup device as a package, the image pickup device may be structured by a single semiconductor substrate or a plurality of semiconductor substrates superimposed on one another in the package.

Figure 18:
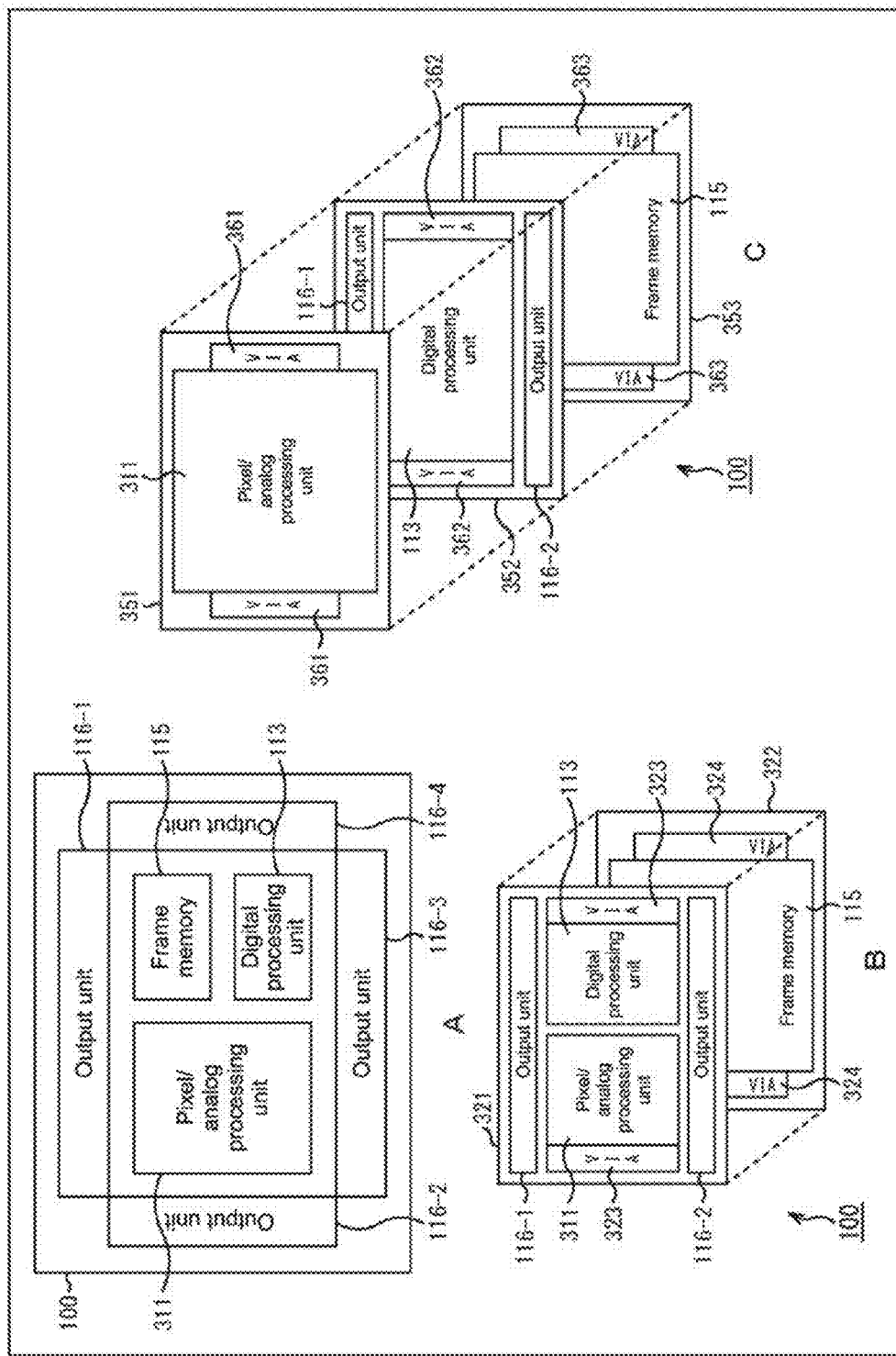
FIG. 18 Diagram each showing an example of a physical structure of the image sensor.

FIG. 18 are diagram each showing an example of a physical structure of the image sensor 100 as the image pickup device to which the present technique is applied.

In the case of the example shown in FIG. 18A, all of the circuit structures of the image sensor 100 described with reference to FIG. 3 are formed on a single semiconductor substrate. In the case of the example shown in FIG. 18A, output units 116-1 to 116-4 are arranged so as to surround a pixel/analog processing unit 311, the digital processing unit 113, and the frame memory 115. The pixel/analog processing unit 311 is an area where the structures of the pixel array unit 111 and the analog processing unit 112 (e.g., pixel array and A/D conversion section) are formed. The output units 116-1 to 116-4 are each an area where the structure of the output unit 116 (e.g., I/O cell) is formed.

Of course, the structural example shown in FIG. 18A is an example, and the arrangements of the structures of the processing units are not limited thereto.

In the case of the example shown in FIG. 18B, the circuit structures of the image sensor 100 described with reference to FIG. 3 are formed on two semiconductor substrates (multilayer chip (pixel chip 321 and circuit chip 322)) superimposed on each other.

On the pixel chip 321, the pixel/analog processing unit 311, the digital processing unit 113, and the output units 116-1 and 116-2 are formed. The output units 116-1 and 116-2 are each an area where the structure of the output unit 116 (e.g., I/O cell) is formed.

Further, the frame memory 115 is formed on the circuit chip 322.

As described above, the pixel chip 321 and the circuit chip 322 are superimposed on each other and form a multilayer structure (laminated structure). The digital processing unit 113 formed on the pixel chip 321 and the frame memory 115 formed on the circuit chip 322 are electrically connected to each other via through holes (VIAS) formed in via areas (VIAS) 323 and via areas (VIAS) 324 (memory bus 114 is formed).

The present technique is also applicable to the image sensor having the multilayer structure as described above. It should be noted that the number of semiconductor substrates (multilayer chips) is arbitrary and may be 3 or more as shown in FIG. 18C.

In the case of the example shown in FIG. 18C, the image sensor 100 includes a semiconductor substrate 351, a semiconductor substrate 352, and a semiconductor substrate 353. The semiconductor substrates 351 to 353 are superimposed on one another and form a multilayer structure (laminated structure). The pixel/analog processing unit 311 is formed on the semiconductor substrate 351. The digital processing unit 113 and the output units 116 are formed on the semiconductor substrate 352. The frame memory 115 is formed on the semiconductor substrate 353. The processing units of the semiconductor substrates are electrically connected to one another via through holes (VIAs) 361 to 363.

The present technique is also applicable to the image sensor having the multilayer structure as described above. Of course, the processing units to be formed on the respective semiconductor substrates are arbitrary and are not limited to the examples shown in FIGS. 18.

<4. Fourth Embodiment>
<Image Pickup Apparatus>

Figure 19:
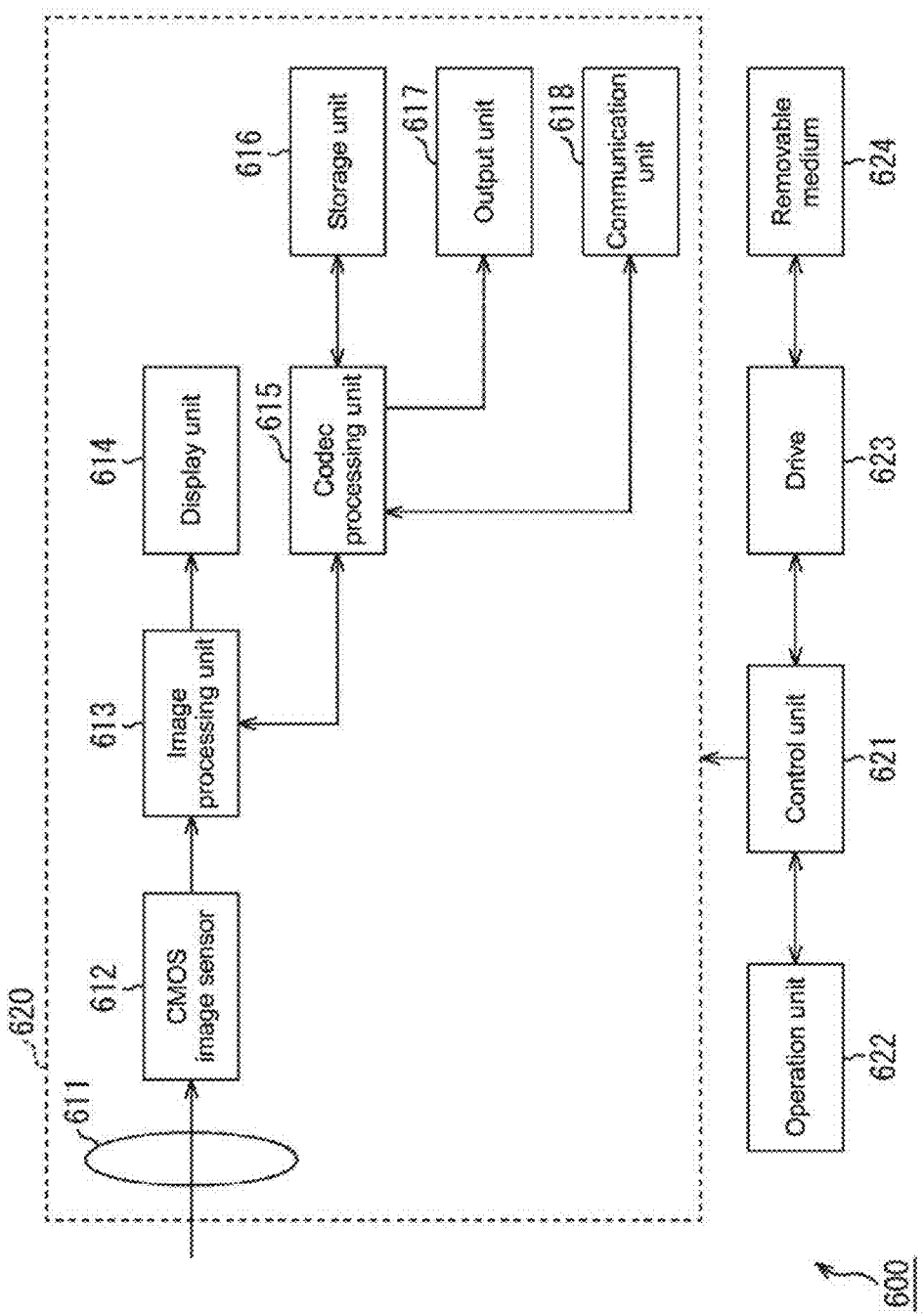
FIG. 19 A diagram showing a main structural example of an image pickup apparatus.

It should be noted that the present technique is also applicable to apparatuses other than the image pickup device. For example, the present technique may be applied to an apparatus (electronic apparatus etc.) including the image pickup device, such as an image pickup apparatus. FIG. 19 is a block diagram showing a main structural example of the image pickup apparatus as an example of the electronic apparatus to which the present technique is applied. The image pickup apparatus 600 shown in FIG. 19 is an apparatus that photographs an object and outputs an image of the object as electric signals.

As shown in FIG. 19, the image pickup apparatus 600 includes an optical unit 611, a CMOS image sensor 612, an image processing unit 613, a display unit 614, a codec processing unit 615, a storage unit 616, an output unit 617, a communication unit 618, a control unit 621, an operation unit 622, and a drive 623.

The optical unit 611 is constituted of a lens that adjusts a focal point with respect to an object and collects light from a focused point, an aperture that adjusts exposure, a shutter that controls an image pickup timing, and the like. The optical unit 611 transmits light from the object (incident light) and supplies the light to the CMOS image sensor 612.

The CMOS image sensor 612 photoelectrically converts incident light, A/D-converts a signal of each pixel (pixel signal), subjects the pixel signals to signal processing such as CDS, and supplies the processed pickup image data to the image processing unit 613.

The image processing unit 613 carries out image processing on the pickup image data obtained by the CMOS image sensor 612. More specifically, the image processing unit 613 carries out, on the pickup image data supplied from the CMOS image sensor 612, various types of image processing such as mixed color correction, black level correction, white balance adjustment, de-mosaic processing, matrix processing, gamma correction, and YC conversion. The image processing unit 613 supplies the pickup image data subjected to the image processing to the display unit 614.

The display unit 614 is structured as a liquid crystal display or the like and displays an image of the pickup image data supplied from the image processing unit 613 (e.g., image of object), for example.

The image processing unit 613 also supplies the pickup image data subjected to the image processing to the codec processing unit 615 as necessary.

The codec processing unit 615 carries out encoding processing by a predetermined method on the pickup image data supplied from the image processing unit 613, and supplies the obtained encoded data to the storage unit 616. The codec processing unit 615 also reads out encoded data recorded in the storage unit 616, decodes the encoded data to generate decoded image data, and supplies the decoded image data to the image processing unit 613.

The image processing unit 613 carries out predetermined image processing on the decoded image data supplied from the codec processing unit 615. The image processing unit 613 supplies the decoded image data subjected to the image processing to the display unit 614. The display unit 614 is structured as a liquid crystal display or the like and displays an image of the decoded image data supplied from the image processing unit 613.

The codec processing unit 615 may also supply encoded data obtained by encoding the pickup image data supplied from the image processing unit 613 or encoded data of the pickup image data read out from the storage unit 616 to the output unit 617 so that the output unit 617 outputs the encoded data to an apparatus outside the image pickup apparatus 600. The codec processing unit 615 may also supply pickup image data not yet encoded or decoded image data obtained by decoding the encoded data read out from the storage unit 616 to the output unit 617 so that the output unit 617 outputs the data to an apparatus outside the image pickup apparatus 600.

The codec processing unit 615 may also transmit encoded data of the pickup image data or the decoded image data to another apparatus via the communication unit 618. The codec processing unit 615 may also acquire pickup image data or encoded data of image data via the communication unit 618. The codec processing unit 615 carries out encoding, decoding, and the like on the pickup image data or encoded data of image data acquired via the communication unit 618 as appropriate. The codec processing unit 615 may also supply the obtained image data or encoded data to the image processing unit 613 or output it to the storage unit 616, the output unit 617, and the communication unit 618 as described above.

The storage unit 616 stores encoded data supplied from the codec processing unit 615 and the like. The encoded data stored in the storage unit 616 is read out and decoded as necessary by the codec processing unit 615. The pickup image data obtained by the decoding processing is supplied to the display unit 614, and a pickup image corresponding to the pickup image data is displayed on the display unit 614.

The output unit 617 includes an external output interface such as an external output terminal and outputs various types of data supplied via the codec processing unit 615 to an apparatus outside the image pickup apparatus 600 via the external output interface.

The communication unit 618 supplies various types of information such as image data and encoded data supplied from the codec processing unit 615 to another apparatus as a communication counterpart in predetermined communication (wired communication or wireless communication). The communication unit 618 acquires, from another apparatus as a communication counterpart in predetermined communication (wired communication or wireless communication), various types of information such as image data and encoded data, and supplies the information to the codec processing unit 615.

The control unit 621 controls operations of the respective processing units (processing units surrounded by dotted line 620, operation unit 622, and drive 623) of the image pickup apparatus 600.

The operation unit 622 is constituted of an arbitrary input device such as a jog dial (registered trademark), keys, buttons, and a touch panel. For example, the operation unit 622 receives operation inputs made by a user or the like and supplies signals corresponding to those operation inputs to the control unit 621.

The drive 623 reads out information from a removable medium 624 loaded therein, such as a magnetic disk, an optical disc, a magneto-optical disc, and a semiconductor memory. The drive 623 reads out various types of information such as programs and data from the removable medium 624 and supplies the information to the control unit 621. When a rewritable removable medium 624 is loaded therein, the drive 623 also writes various types of information such as image data and encoded data, that is supplied via the control unit 621, in the removable medium 624.

The present technique described in the embodiments above is applied to the CMOS image sensor 612 of the image pickup apparatus 600 structured as described above. Specifically, the image sensor 100 described above is used as the CMOS image sensor 612. As a result, the CMOS image sensor 612 can obtain more diverse pickup images. Therefore, the image pickup apparatus 600 can obtain more diverse pickup images by photographing an object.

It should be noted that the image pickup apparatus to which the present technique is applied is not limited to the structures described above, and other structures may also be adopted. For example, the present technique is applicable to not only a digital still camera and a video camera but also information processing apparatuses having an image pickup function, such as a cellular phone, a smartphone, a tablet-type device, and a personal computer. Moreover, the present technique is also applicable to a camera module used by being mounted on other information processing apparatuses (or equipped as built-in device).

The series of processing described above can be executed either by hardware or software. When executing the series of processing described above by software, a program constituting the software are installed from a network or recording medium.

The recording medium is constituted of the removable medium 624 that records a program, the removable medium 624 being provided separate from the apparatus body as shown in FIG. 19 and distributed to a user for delivering the program, for example. The removable medium 624 includes a magnetic disk (including flexible disk) and an optical disc (including CD-ROM and DVD). The removable medium 624 also includes a magneto-optical disc (including MD (Mini Disc)) and a semiconductor memory.

In this case, the program can be installed in the storage unit 616 by loading the removable medium 624 in the drive 623.

The program can also be provided via wired or wireless transmission media such as a local area network, the Internet, and digital satellite broadcast. In this case, the program can be installed in the storage unit 616 by receiving the program via the communication unit 618.

In addition, the program can be installed in advance in the storage unit 616, a ROM (Read Only Memory) inside the control unit 621, or the like.

It should be noted that the program to be executed by a computer may be a program in which processing are carried out in time series in the order described in the specification, or may be a program in which processing are carried out in parallel or at necessary timings such as when invoked.

In the specification, the steps describing the program recorded onto the recording medium include not only processing that are carried out in time series in the described order, but also processing that do not necessarily need to be processed in time series and are carried out in parallel or independently.

Further, the processing of the steps described above can be executed in the apparatuses described above or arbitrary apparatuses excluding the apparatuses described above. In this case, an apparatus that executes the processing only needs to have functions (functional blocks etc.) requisite for executing the processing. Moreover, information requisite for the processing only needs to be transmitted to the apparatus as appropriate.

Furthermore, in the specification, the system refers to a group of a plurality of structural elements (apparatuses, modules (components), etc.), and whether all the structural elements are within the same casing is irrelevant. Therefore, a plurality of apparatuses that are accommodated in different casings and connected via a network and one apparatus in which a plurality of modules are accommodated in one casing are both referred to as system.

Further, the structure described as one apparatus (or processing unit) above may be divided so as to be structured as a plurality of apparatuses (or processing units). Conversely, the structures described as the plurality of apparatuses (or processing units) above may be structured as one apparatus (or processing unit). In addition, structures other than those described above may of course be added to the structures of the apparatuses (or processing units). Furthermore, as long as the structures and operations as the entire system are substantially the same, a part of a structure of a certain apparatus (or processing unit) may be incorporated into that of another apparatus (or another processing unit).

Heretofore, the favorable embodiments of the present disclosure have been described in detail with reference to the attached drawings. However, the technical range of the present disclosure is not limited to the examples above. It should be understood by those skilled in the art that various modifications, combinations, sub-combinations and alterations may occur depending on design requirements and other factors insofar as they are within the scope of the appended claims or the equivalents thereof.

For example, the present technique may have a cloud computing structure in which a plurality of apparatuses divisionally and cooperatively process one function via a network.

Further, the steps described with reference to the flowcharts above can be executed divisionally by a plurality of apparatuses instead of executing the steps by one apparatus.

Furthermore, when one step includes a plurality of processing, the plurality of processing included in that one step can be executed divisionally by a plurality of apparatuses instead of executing them by one apparatus.

The present technique is not limited to those examples and can be embodied as various structures to be mounted on an apparatus constituting such an apparatus or system, such as a processor as a system LSI (Large Scale Integration) or the like, a module that uses a plurality of processors and the like, a unit that uses a plurality of modules and the like, and a set in which other functions are added to a unit.

It should be noted that the image pickup apparatus to which the present technique is applied is not limited to the structures described above, and other structures may also be adopted. For example, the present technique is applicable to not only a digital still camera and a video camera but also information processing apparatuses having an image pickup function, such as a cellular phone, a smartphone, a tablet-type device, and a personal computer. Moreover, the present technique is also applicable to a camera module used by being mounted on other information processing apparatuses (or equipped as built-in device).

Further, the structure described as one apparatus (or processing unit) above may be divided so as to be structured as a plurality of apparatuses (or processing units). Conversely, the structures described as the plurality of apparatuses (or processing units) above may be structured as one apparatus (or processing unit). In addition, structures other than those described above may of course be added to the structures of the apparatuses (or processing units). Furthermore, as long as the structures and operations as the entire system are substantially the same, a part of a structure of a certain apparatus (or processing unit) may be incorporated into that of another apparatus (or another processing unit).

Heretofore, the favorable embodiments of the present disclosure have been described in detail with reference to the attached drawings. However, the technical range of the present disclosure is not limited to the examples above. It should be understood by those skilled in the art that various modifications, combinations, sub-combinations and alterations may occur depending on design requirements and other factors insofar as they are within the scope of the appended claims or the equivalents thereof.

It should be noted that the present technique may also take the following structures.

(1) An image pickup device, including:
   a pixel array that reads out pixel signals obtained by photoelectrically converting incident light, from each of a plurality of pixels in the pixel array;
   an analog processing unit that carries out signal processing on the analog pixel signals to obtain digital image data;
   a storage unit that stores the image data;
   a signal processing unit that carries out signal processing on the image data stored in the storage unit;
   an output unit that outputs the image data stored in the storage unit; and
   a control unit that causes the pixel array to execute reading processing of reading out the pixel signals, the analog processing unit to execute analog processing as signal processing on the analog pixel signals, the signal processing unit to execute digital processing as signal processing on the digital image data, and the output unit to execute output processing of outputting the image data, at processing speeds independent from one another.

(2) The image pickup device according to (1) or any one of (3) to (12),
   in which the control unit causes the reading processing and the analog processing to be executed at a higher speed than the digital processing and the output processing.

(3) The image pickup device according to (1), (2), or any one of (4) to (12),
   in which the control unit further causes the digital processing to be executed at a lower speed than the output processing.

(4) The image pickup device according to any one of (1) to (3) and (5) to (12),
   in which the control unit causes the digital processing to be executed at a higher speed than the reading processing, the analog processing, and the output processing.

(5) The image pickup device according to any one of (1) to (4) and (6) to (12),
   in which the control unit causes the digital processing to be executed a plurality of times during a 1-frame processing period.

(6) The image pickup device according to any one of (1) to (5) and (7) to (12),
   in which the control unit causes the reading processing and the analog processing to be executed at a higher speed and higher rate than the digital processing and the output processing.

(7) The image pickup device according to any one of (1) to (6) and (8) to (12),
   in which the storage unit is a frame memory.

(8) The image pickup device according to any one of (1) to (7) and (9) to (12),
   in which the frame memory includes a ring buffer that stores a predetermined number of latest frames.

(9) The image pickup device according to any one of (1) to (8) and (10) to (12),
   in which the control unit causes the digital processing to be executed on image data of a past frame stored in the ring buffer.

(10) The image pickup device according to any one of (1) to (9), (11), and (12), in which
   the frame memory has a storage capacity capable of storing image data of a plurality of frames, and
   the control unit causes the digital processing to be executed on image data of a past frame stored in the frame memory.

(11) The image pickup device according to any one of (1) to (10) and (12), further including
   a single semiconductor substrate,
   in which the pixel array, the analog processing unit, the storage unit, the signal processing unit, the output unit, and the control unit are formed on the semiconductor substrate. (12) The image pickup device according to any one of (1) to (11), further including
   a plurality of semiconductor substrates superimposed on one another,
   in which each of the pixel array, the analog processing unit, the storage unit, the signal processing unit, the output unit, and the control unit is formed on the corresponding one of the plurality of semiconductor substrates.

(13) A control method, including
   executing, at processing speeds independent from one another, reading processing of reading out pixel signals obtained by photoelectrically converting incident light, from each of a plurality of pixels in a pixel array, analog processing of carrying out signal processing on the analog pixel signals read out from the pixels of the pixel array to obtain digital image data, digital processing as signal processing on the digital image data stored in a storage unit, and output processing of outputting the digital image data stored in the storage unit.

(14) An image pickup apparatus, including:
   an image pickup unit that photographs an object; and
   an image processing unit that carries out image processing on image data obtained by the image pickup unit,
   the image pickup unit including
      a pixel array that reads out pixel signals obtained by photoelectrically converting incident light, from each of a plurality of pixels in the pixel array,
      an analog processing unit that carries out signal processing on the analog pixel signals to obtain digital image data,
      a storage unit that stores the image data,
      a signal processing unit that carries out signal processing on the image data stored in the storage unit,
      an output unit that outputs the image data stored in the storage unit, and
      a control unit that causes the pixel array to execute reading processing of reading out the pixel signals, the analog processing unit to execute analog processing as signal processing on the analog pixel signals, the signal processing unit to execute digital processing as signal processing on the digital image data, and the output unit to execute output processing of outputting the image data, at processing speeds independent from one another.

DESCRIPTION OF REFERENCE NUMERALS 100 image sensor
111 pixel array unit
112 analog processing unit
113 digital processing unit
114 memory bus
115 frame memory
116 output unit
121 timing control unit
122 signal processing unit
321 pixel chip
322 circuit chip
600 image pickup apparatus
612 CMOS image sensor

The invention claimed is:

1. An image pickup device, comprising:
a pixel array that comprises a plurality of pixels, wherein the plurality of pixels is configured to convert incident light into analog pixel signals, and wherein the pixel array is configured to execute reading processing to read the analog pixel signals from each of the plurality of pixels; and
circuitry configured to:
execute analog signal processing on the analog pixel signals to obtain digital image data;
store the digital image data;
execute digital signal processing on the stored digital image data;
execute output processing to output the processed digital image data; and
set each of a processing speed of the reading processing, a processing speed of the analog signal processing, a processing speed of the digital signal processing, and a processing speed of the output processing,
wherein the processing speed of the reading processing, the processing speed of the analog signal processing, the processing speed of the digital signal processing, and the processing speed of the output processing are mutually independent.

2. The image pickup device according to claim 1, wherein the circuitry is further configured to set each of the processing speed of the reading processing and the processing speed of the analog signal processing to be higher than each of the processing speed of the digital signal processing and the processing speed of the output processing.

3. The image pickup device according to claim 2, wherein the circuitry is further configured to set the processing speed of the digital signal processing to be lower than the processing speed of the output processing.

4. The image pickup device according to claim 1, wherein the circuitry is further configured to set the processing speed of the digital signal processing to be higher than each of the processing speed of the reading processing, the processing speed of the analog signal processing, and the processing speed of the output processing.

5. The image pickup device according to claim 4, wherein the circuitry is further configured to execute the digital signal processing a plurality of times in a 1-frame processing period.

6. The image pickup device according to claim 1, wherein the circuitry is further configured to set each of a frame rate of the reading processing and a frame rate of the analog signal processing to be higher than each of a frame rate of the digital signal processing and a frame rate of the output processing.

7. The image pickup device according to claim 1, wherein the circuitry is further configured to store the digital image data in a frame memory.

8. The image pickup device according to claim 7, wherein the frame memory includes a ring buffer configured to store a plurality of latest frames.

9. The image pickup device according to claim 8, wherein the circuitry is further configured to execute the digital signal processing on image data of a past frame of the plurality of latest frames stored in the ring buffer.

10. The image pickup device according to claim 7,
wherein the frame memory is configured to store first image data of a plurality of frames, and
wherein the circuitry is further configured to execute the digital signal processing on second image data of a past frame of the plurality of frames stored in the frame memory.

11. The image pickup device according to claim 1, further comprising a single semiconductor substrate, wherein the pixel array and the circuitry are on the single semiconductor substrate.

12. The image pickup device according to claim 1, further comprising a plurality of semiconductor substrates superimposed on one another, wherein each of the pixel array and the circuitry is on a respective one of the plurality of semiconductor substrates.

13. A control method, comprising:
executing reading processing to read analog pixel signals from each of a plurality of pixels in a pixel array,
wherein the plurality of pixels is configured to convert incident light into the analog pixel signals;
executing analog signal processing on the analog pixel signals to obtain digital image data;
executing digital signal processing the digital image data;
executing output processing to output the processed digital image data; and
setting each of a processing speed of the reading processing, a processing speed of the analog signal processing, a processing speed of the digital signal processing, and a processing speed of the output processing,
wherein the processing speed of the reading processing, the processing speed of the analog signal processing, the processing speed of the digital signal processing, and the processing speed of the output processing are mutually independent.

14. An image pickup apparatus, comprising:
an image pickup sensor configured to capture image data of an object; and
a processor configured to:
receive the captured image data from the image pickup sensor; and
execute image processing on the captured image data,
wherein the image pickup sensor comprises:
a pixel array that comprises a plurality of pixels, wherein the plurality of pixels is configured to convert incident light into analog pixel signals, and
wherein the pixel array is configured to execute reading processing to read the analog pixel signals from each of the plurality of pixels; and
circuitry configured to:
execute analog signal processing on the analog pixel signals to obtain digital image data;
store the digital image data;

execute digital signal processing on the stored digital image data;

execute output processing to output the processed digital image data; and set each of a processing speed of the reading processing, a processing speed of the analog signal processing, a processing speed of the digital signal processing, and a processing speed of the output processing, wherein the processing speed of the reading processing, the processing speed of the analog signal processing, the processing speed of the digital signal processing, and the processing speed of the output processing are mutually independent.

* * * * *